US012701659B2

(12) United States Patent
Cho et al.

(10) Patent No.: US 12,701,659 B2
(45) Date of Patent: Aug. 4, 2026

(54) CIRCUIT BOARD MODULE AND METHOD FOR MANUFACTURING SAME

(71) Applicant: SAMSUNG ELECTRONICS CO., LTD., Suwon-si (KR)

(72) Inventors: Yonglak Cho, Suwon-si (KR); Joohan Kim, Suwon-si (KR); Juho Kim, Suwon-si (KR); Min Park, Suwon-si (KR); Eunsoo Park, Suwon-si (KR); Insun An, Suwon-si (KR); Byungwoo Lee, Suwon-si (KR); Sangtae Lee, Suwon-si (KR); Haejin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 18/438,124

(22) Filed: Feb. 9, 2024

(65) Prior Publication Data

US 2024/0188218 A1 Jun. 6, 2024

Related U.S. Application Data

(63) Continuation of application No. PCT/KR2022/011858, filed on Aug. 9, 2022.

(30) Foreign Application Priority Data

Aug. 10, 2021 (KR) ........................ 10-2021-0105202

(51) Int. Cl.
*H05K 1/14* (2006.01)
*H05K 3/28* (2006.01)
*H05K 1/181* (2026.01)

(52) U.S. Cl.
CPC ............. *H05K 1/144* (2013.01); *H05K 3/284* (2013.01); *H05K 1/181* (2013.01);
(Continued)

(58) Field of Classification Search
CPC ............. H05K 1/144; H05K 2201/042; H05K 2201/09063; H05K 2201/10378; H05K 2201/1178; H05K 3/284; H05K 1/14–145
See application file for complete search history.

(56) References Cited

U.S. PATENT DOCUMENTS 6,375,064 B1 4/2002 Edasawa et al.
2001/0023995 A1 9/2001 Nguyen et al.
(Continued)

FOREIGN PATENT DOCUMENTS

CN 101502189 A 8/2009
CN 112243314 A 1/2021
(Continued)

OTHER PUBLICATIONS

International Search Report (PCT/ISA/210) issued Nov. 16, 2022 by the International Searching Authority in International Patent Application No. PCT/KR2022/011858.
(Continued)

*Primary Examiner* — Paresh Paghadal
(74) *Attorney, Agent, or Firm* — Sughrue Mion, PLLC

(57) ABSTRACT

A circuit board module includes a first substrate, a second substrate provided above the first substrate and including a first inlet, a first interposer provided between the first substrate and the second substrate, the first interposer connecting the first substrate and the second substrate and providing a first space between the first substrate and the second substrate, a sealing member covering the first inlet, and a filler provided between the first substrate and the second substrate, where the sealing member includes an insertion area configured to receive a nozzle that injects the filler to be inserted into the first inlet and at least one of the first substrate, the second substrate and the first interposer includes a first opening configured to introduce air into the
(Continued)

first space and a second opening configured to exhaust air from the first space.

13 Claims, 25 Drawing Sheets

(52) U.S. Cl.
CPC .................. *H05K 2201/042* (2013.01); *H05K 2201/09063* (2013.01); *H05K 2201/10378* (2013.01); *H05K 2201/10545* (2013.01)

(56) References Cited

U.S. PATENT DOCUMENTS

| | | | |
|---|---|---|---|
| 2006/0033199 A1 | 2/2006 | Kawakami et al. | |
| 2009/0059498 A1* | 3/2009 | Jeong ................... | G06F 1/1656 361/748 |
| 2010/0230147 A1 | 9/2010 | Gokan et al. | |
| 2011/0096506 A1* | 4/2011 | Huang .................... | H05K 7/20 361/729 |
| 2012/0081864 A1* | 4/2012 | Sakurai ................ | H05K 3/0052 361/753 |
| 2015/0115466 A1 | 4/2015 | Kim | |
| 2016/0095227 A1 | 3/2016 | Takano et al. | |
| 2016/0165727 A1 | 6/2016 | Liskow | |
| 2016/0174377 A1 | 6/2016 | Chuah et al. | |
| 2018/0337055 A1* | 11/2018 | Yamaguchi .......... | H10D 64/033 |
| 2019/0139915 A1 | 5/2019 | Dalmia et al. | |
| 2020/0064544 A1* | 2/2020 | Gipson ................ | H05K 3/0014 |
| 2020/0152532 A1 | 5/2020 | Blank et al. | |
| 2020/0194341 A1 | 6/2020 | Cheng | |
| 2021/0120150 A1 | 4/2021 | Moon | |
| 2021/0144856 A1 | 5/2021 | Park et al. | |
| 2021/0337055 A1 | 10/2021 | Lee et al. | |

FOREIGN PATENT DOCUMENTS

| | | | |
|---|---|---|---|
| JP | 8-31983 | A | 2/1996 |
| JP | 10-112481 | A | 4/1998 |
| JP | 2000-269378 | A | 9/2000 |
| JP | 2000-286360 | A | 10/2000 |
| JP | 2006-54274 | A | 2/2006 |
| JP | 2006-156507 | A | 6/2006 |
| JP | 2010-4062 | A | 1/2010 |
| JP | 2012-253104 | A | 12/2012 |
| JP | 2013-69942 | A | 4/2013 |
| JP | 2015-76580 | A | 4/2015 |
| JP | 2015-95562 | A | 5/2015 |
| JP | 2017-99035 | A | 6/2017 |
| JP | 2020-80398 | A | 5/2020 |
| JP | 2020-520553 | A | 7/2020 |
| KR | 10-1538680 | B1 | 7/2015 |
| KR | 10 2020 0085069 | A | 7/2020 |
| KR | 10 2021 0046256 | A | 4/2021 |
| KR | 10-2245770 | B1 | 4/2021 |
| WO | 2021/135590 | A1 | 7/2021 |

OTHER PUBLICATIONS

Written Opinion (PCT/ISA/237) issued Nov. 16, 2022 by the International Searching Authority in International Patent Application No. PCT/KR2022/011858.

Communication dated Aug. 29, 2025 issued by the Korean Intellectual Property Office in Korean Patent Application No. 10-2021-0105202.

Communication dated Jan. 9, 2025 issued by the European Patent Office in European Patent Application No. 22856177.5.

\* cited by examiner

CIRCUIT BOARD MODULE AND METHOD FOR MANUFACTURING SAME

CROSS-REFERENCE TO RELATED APPLICATIONS

This application is a Continuation of International Application No. PCT/KR2022/011858, filed on Aug. 9, 2022, in the Korean Intellectual Property Receiving Office, which is based on and claims priority to Korean Patent Application No. 10-2021-0105202, filed on Aug. 10, 2021, in the Korean Intellectual Property Office, the disclosures of which are incorporated herein by reference in their entireties.

BACKGROUND

1. Field

The disclosure relates to a circuit board module, an electronic device including the circuit board module, and a method of manufacturing the same.

2. Description of Related Art

Due to advances in information and communication technology, as well as semiconductor technology, the spread and use of various electronic devices have been increasing rapidly. In particular, recent electronic devices have been developed to be portable and enable communication.

An electronic device may refer to any device that performs a specific function according to a program installed thereon, such as a consumer electronics device, an electronic notebook, a portable multimedia player, a mobile communication terminal, a tablet personal computer (PC), an audio/video device, a desktop/laptop computer, or an in-vehicle navigation system. For example, these electronic devices may output stored and/or transmitted information as sound or an image. In recent years, as the integration level of electronic devices has increased and high-speed, large-capacity wireless communication has become more common, and a single electronic device, such as a mobile communication terminal, may be equipped with a variety of functions. For example, in addition to a communication function, an entertainment function such as gaming, a multimedia function such as music and video playback, a communication and security function such as mobile banking, and a function such as schedule management and an electronic wallet are integrated into a single electronic device. These electronic devices are being miniaturized such that they may be conveniently carried by users.

A printed circuit board (PCB) disposed within an electronic device may be manufactured as a stacked type (e.g., a circuit board module), for mounting efficiency. Circuit boards located within the stacked PCB may be designed to be side by side with corresponding sizes. In this structure, many empty spaces exist according to various thicknesses of components mounted therein.

There may be various heat sources (e.g., an application processor) on a PCB. In such an environment, it may be necessary to apply a filler to the interior of a stacked PCB, for dissipation of heat generated by heat sources. In applying the filler to the interior of the PCB, the viscosity of the filler or the thermal expansion of air inside the PCB may cause the filler to flow back or out.

SUMMARY

Provided is a printed circuit board (PCB), which includes a sealing member sealing a filler inlet, such that, when a high-viscosity filler is injected into the PCB at a high speed, backflow of the filler may be prevented.

Provided is a circuit board module with a plurality of openings for controlling an air flow inside a PCB, such that a filler may be applied stably when a high temperature environment is created inside the PCB.

Additional aspects will be set forth in part in the description which follows and, in part, will be apparent from the description, or may be learned by practice of the presented embodiments.

According to an aspect of the disclosure, a circuit board module may include a first substrate, a second substrate provided above the first substrate and including a first inlet, a first interposer provided between the first substrate and the second substrate, the first interposer connecting the first substrate and the second substrate and providing a first space between the first substrate and the second substrate, a sealing member covering the first inlet, and a filler provided between the first substrate and the second substrate, where the sealing member includes an insertion area configured to receive a nozzle that injects the filler to be inserted into the first inlet and at least one of the first substrate, the second substrate and the first interposer includes a first opening configured to introduce air into the first space and a second opening configured to exhaust air from the first space.

The second substrate may include the first opening and the second opening.

The first opening may be on a first side of the second substrate and the second opening may be on a second side of the second substrate that is opposite to the first side of the second substrate.

The second substrate may include the first opening and the first interposer may include the second opening.

The filler may be provided under the first inlet.

A distance between the first inlet and the first opening or a distance between the first inlet and the second opening may be less than a distance between the first opening and the second opening.

A distance between the first inlet and the first opening or a distance between the first inlet and the second opening may be equal to or larger than a threshold distance, and the threshold distance may be determined based on at least one of an injection rate of the filler and an injection time of the filler.

The insertion area may be configured to expand in response to applied pressure, and to be restored and substantially seal the first inlet when the pressure is removed.

The insertion area may be cross-shaped.

The sealing member may include a deformation-resistant area on a top surface thereof configured to prevent deformation of the sealing member, and the deformation-resistant area may overlap the insertion area or is adjacent to the insertion area.

The sealing member may be configured to prevent backflow of the filler when the nozzle is inserted into the insertion area.

The circuit board module may include a third substrate provided above the second substrate, the third substrate including a second inlet and a second interposer connecting the second substrate and the third substrate and providing a second space between the second substrate and the third substrate, where the second inlet may be provided at a position corresponding to the first inlet such that the second inlet and the first inlet are configured to receive the nozzle.

The second substrate may include a third opening configured to allow the filler to be introduced from the second space into the first space or to allow air to be introduced from the first opening into the first space.

The circuit board module may include a heat source provided on the first substrate or the second substrate, where the filler may be applied to an area corresponding to a position where the heat source is provided.

The sealing member may include a rubber material and the rubber material may include conductive material or non-conductive material.

According to an aspect of the disclosure, a circuit board module may include a first substrate, a second substrate above the first substrate, such that a space is between the first substrate and the second substrate, an inlet on the second substrate, a sealing member on the inlet, the sealing member including an insertion area configured to receive a nozzle, a first opening on the first substrate or the second substrate, the first opening configured to introduce air into the space while a filler is being injected into the space with the nozzle, and a second opening on the first substrate or the second substrate, the second opening configured to exhaust air out of the space while the filler is being injected into the space with the nozzle.

According to an aspect of the disclosure, a method of injecting a filler into a circuit board module may include preparing a circuit board module, the circuit board module including a first substrate, a second substrate above the first substrate, an interposer connecting the first substrate and the second substrate and providing a space between the first substrate and the second substrate, an inlet on the second substrate, and a sealing member on the inlet, injecting a filler into the space at the inlet, introducing air into the space by a first opening on the first substrate, the second substrate, or the interposer, and exhausting air out of the space by a second opening on the first substrate, the second substrate, or the interposer.

Injecting the filler into the space at the inlet may include inserting a nozzle into the inlet through an insertion area of the sealing member and injecting the filler through the nozzle.

The method may include determining a filler applied area in the space by an inspection hole on the second substrate.

The injecting operation, the introducing air operation, and the exhausting air operation may be performed substantially simultaneously.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
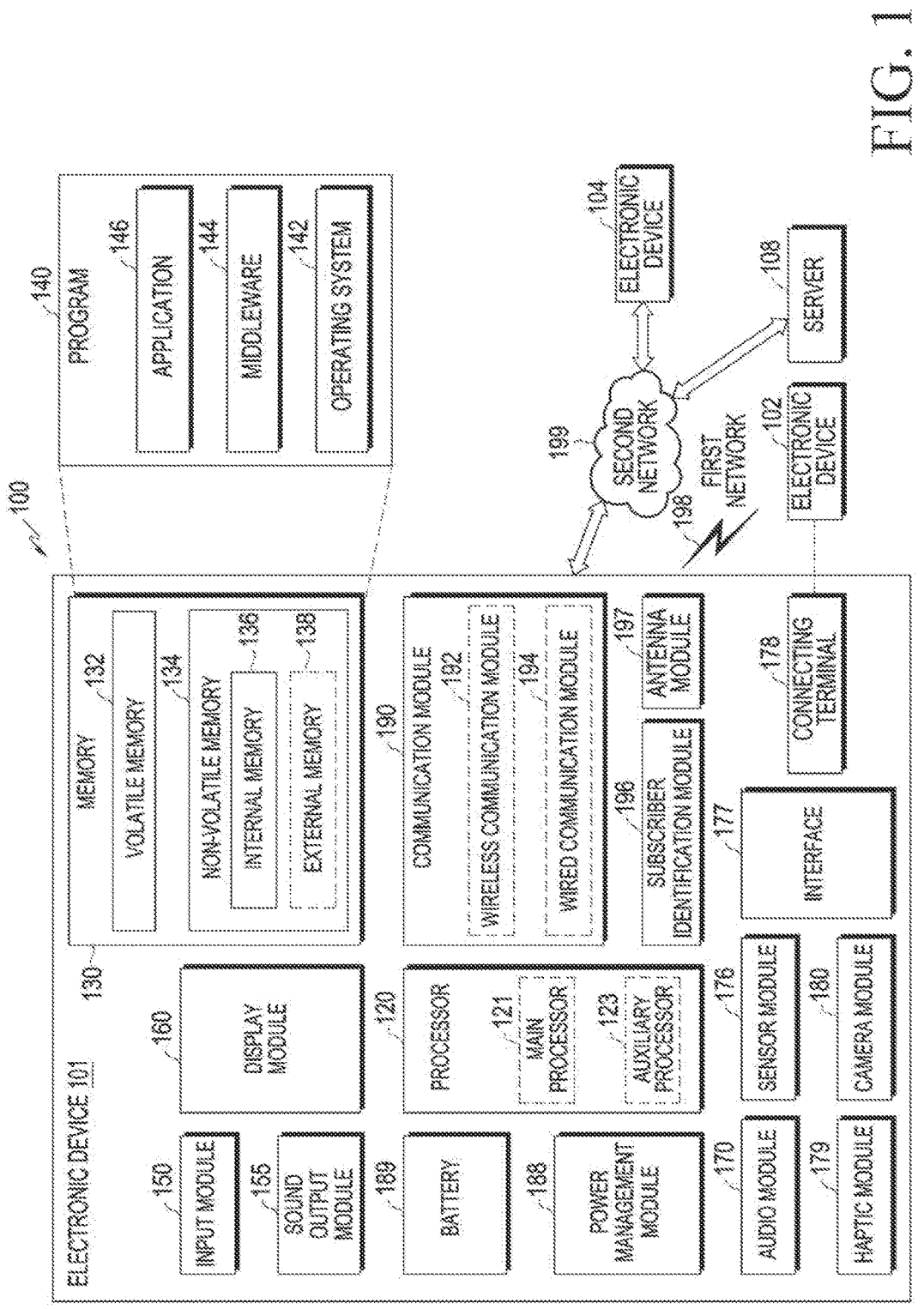
FIG. 1 is a block diagram illustrating an electronic device in a network environment according to various embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

FIG. 1 is a block diagram illustrating an electronic device in a network environment according to various embodiments of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5$^{th}$ generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1$^{st}$" and "2$^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
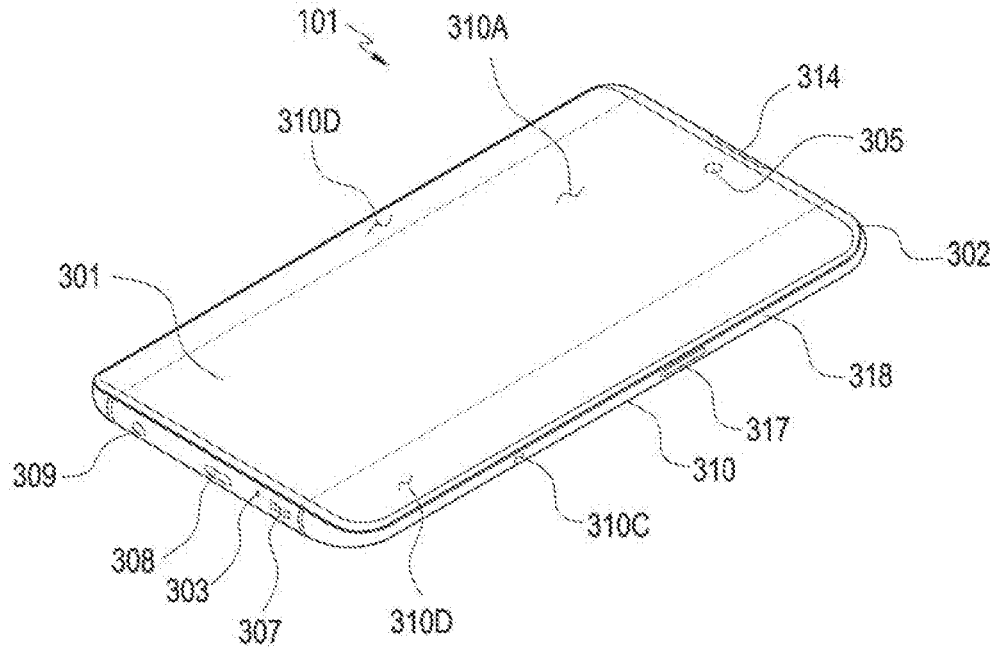
FIG. 2 is a front perspective view illustrating an electronic device according to various embodiments of the disclosure.
Figure 3:
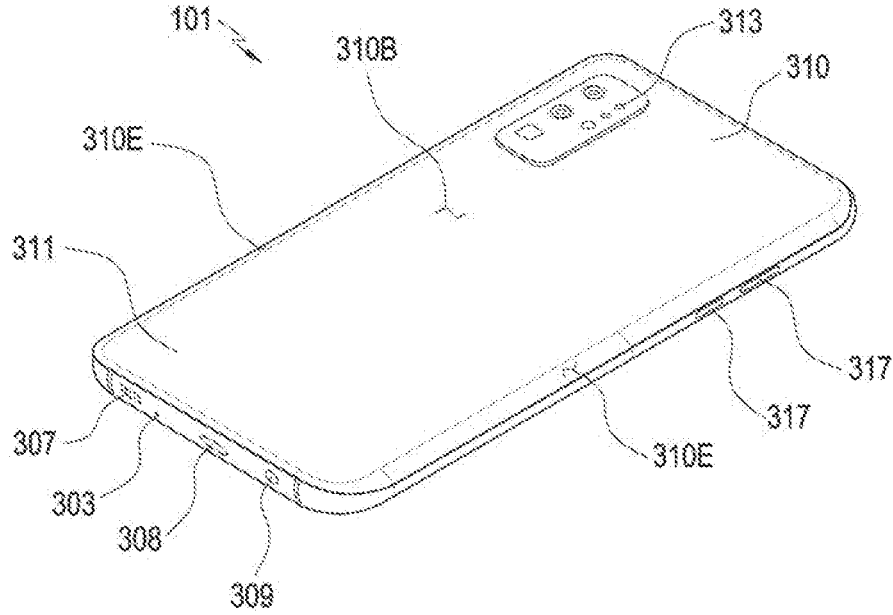
FIG. 3 is a rear perspective view illustrating an electronic device according to various embodiments of the disclosure.

FIG. 2 is a front perspective view illustrating an electronic device according to various embodiments of the disclosure. FIG. 3 is a rear perspective view illustrating an electronic device according to various embodiments of the disclosure.

Referring to FIGS. 2 and 3, the electronic device 101 according to an embodiment may include a housing 310 which includes a front surface 310A, a rear surface 310B, and side surfaces 310C surrounding a space between the front surface 310A and the rear surface 310B. In another embodiment, the housing 310 may refer to a structure that forms a portion of the front surface 310A of FIG. 2, the rear surface 310B of FIG. 3, and the side surfaces 310C. According to an embodiment, at least a portion of the front surface 310A may be formed by a front plate 302 (e.g., a glass plate or polymer plate including various coating layers) which is at least partially substantially transparent. The rear surface 310B may be formed by a rear plate 311. The rear plate 311 may be formed of, for example, glass, ceramic, a polymer, a metal (e.g., aluminum, stainless steel (STS), or magnesium), or a combination of at least two of these materials. The side surfaces 310C may be coupled with the front plate 302 and the rear plate 311 and formed by a side bezel structure (or "side member") 318 including a metal and/or a polymer. In some embodiments, the rear plate 311 and the side bezel structure 318 may be integrally formed and include the same material (e.g., glass, a metal material such as aluminum, or ceramic).

In some embodiments, the front plate 302 may include two first edge areas 310D, which are bent and extend seamlessly from the front surface 310A toward the rear plate 311, at both long edge ends thereof. In some embodiments (see FIG. 3), the rear plate 311 may include two second edge areas 310E, which are bent and extend seamlessly from the rear surface 310B toward the front plate 302, at both long edge ends thereof. In some embodiments, the front plate 302 (or the rear plate 311) may include only one of the first edge areas 310D (or the second edge areas 310E). In another embodiment, some of the first edge areas 310D or the second edge areas 310E may not be included. In some embodiments, when viewed from the sides of the electronic device 101, the side bezel structure 318 may have a first thickness (or width) on a side surface that does not include any of the above first edge areas 310D or second edge areas 310E, and a second thickness less than the first thickness on a side surface that includes the above first edge areas 310D or second edge areas 310E.

According to an embodiment, the electronic device 101 may include at least one of a display 301 (e.g., the display module 160 of FIG. 1), audio modules 303, 307, and 314

(e.g., the audio module 170 of FIG. 1), a sensor module (e.g., the sensor module 176 of FIG. 1), camera modules 305, 312, and 313 (e.g., the camera module 180 of FIG. 1), key input devices 317 (e.g., the input module 150 of FIG. 1), or connector holes 308 and 309 (e.g., the connecting terminal 178 of FIG. 1). In some embodiments, the electronic device 101 may not be provided with at least one (e.g., the connector hole 309) of the components or may additionally include other components.

The display 301 may be visually exposed, for example, through a substantial portion of the front plate 302. In some embodiments, at least a portion of the display 301 may be exposed through the front surface 310A and the front plate 302 forming the first edge areas 310D of the side surfaces 310C. In some embodiments, a corner of the display 301 may be formed substantially in the same shape as that of an adjacent periphery of the front plate 302. In another embodiment, a gap between the periphery of the display 301 and the periphery of the front plate 302 may be substantially equal to increase the visually exposed area of the display 301.

According to an embodiment, a surface (or the front plate 302) of the housing 310 may include a screen display area formed as the display 301 is visually exposed. For example, the screen display area may include the front surface 310A and the first edge areas 310D.

In another embodiment, a recess or an opening may be formed in a portion of the screen display area (e.g., the front surface 310A and the first edge areas 310D), and at least one of the audio module 314, a sensor module, a light emitting element, or the camera module 305, which is aligned with the recess or the opening, may be included. In another embodiment, at least one of the audio module 314, a sensor module, the camera modules 305, a fingerprint sensor, or a light emitting element may be included on a rear surface of the screen display area of the display 301.

According to an embodiment, at least one camera module 305 and 312 may be disposed toward the bottom of the display 301. For example, the first camera module 305 may be disposed in at least a partial area of the display 301 corresponding to a camera field of view (FOV). As the first camera module 305 is disposed in at least a portion of the display 301 corresponding to the camera FOV, the position of the first camera module 305 may not be visually distinguished (or exposed). According to an embodiment, when the display 301 is viewed from the front surface 310A, the first camera module 305 may be disposed in at least a portion of the display 301, corresponding to the camera FOV, and thus obtain an image of an external subject without being visually exposed to the outside. For example, the first camera module 305 may be an under display camera (UDC).

In an embodiment, the electronic device 101 may include a display that is slidably disposed and provides a screen (e.g., the display area). For example, the display area of the electronic device 101 may be an area that is visually exposed and allows for image output. In an example, the electronic device 101 may adjust the display area according to the movement of a sliding plate or the movement of the display. For example, the electronic device 101 may include a rollable electronic device configured to selectively expand the display area by allowing at least a portion (e.g., the housing 310) of the electronic device 101 to be at least partially slidable. This display may also be referred to as a slide-out display or an expandable display, for example.

In another embodiment, the display 301 may be incorporated with or disposed adjacent to a touch sensing circuit, a pressure sensor capable of measuring the intensity (pressure) of a touch, and/or a digitizer that detects a magnetic field-based stylus pen. In some embodiments, at least some of the key input devices 317 may be disposed in the first edge areas 310D and/or the second edge areas 310E.

According to an embodiment, the audio modules 303, 307, and 314 may include, for example, a microphone hole 303 and speaker holes 307 and 314. A microphone for obtaining an external sound may be disposed in the microphone hole 303, and in some embodiments, a plurality of microphones may be disposed to detect the direction of a sound. The speaker holes 307 and 314 may include an external speaker hole 307 and a receiver hole 314 for calls. In some embodiments, the speaker holes 307 and 314 and the microphone hole 303 may be implemented as a single hole, or a speaker (e.g., a piezo speaker) may be included without the speaker holes 307 and 314. The audio modules 303, 307, and 314 are not limited to the above-described structure, and may be subject to various design modifications, such as mounting only some audio module or adding a new audio module, according to the structure of the electronic device 101.

According to an embodiment, the sensor module may generate an electrical signal or data value corresponding to an internal operating state of the electronic device 101 or an external environmental state. The sensor module may include, for example, a first sensor module (e.g., a proximity sensor) and/or a second sensor module (e.g., a fingerprint sensor), disposed on the front surface 310A of the housing 310, and/or a third sensor module (e.g., a heart rate monitor (HRM) sensor) disposed on the rear surface 310B of the housing 310 and/or a fourth sensor module (e.g., a fingerprint sensor). In some embodiments, a fingerprint sensor may be disposed on the rear surface 310B as well as on the front surface 310A (e.g., the display 301) of the housing 310. The electronic device 101 may further include a sensor module, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor. The sensor module is not limited to the above-described structure, and may be subject to various design modifications, such as mounting only some sensor module or adding a new sensor module, according to the structure of the electronic device 101.

According to an embodiment, the camera modules 305, 312, and 313 may include a front camera module 305 disposed on the front surface 310A of the electronic device 101, and a rear camera module 312 disposed on the rear surface 310B, and/or a flash 313. The camera modules 305 and 312 may include one or more lenses, an image sensor, and/or an image signal processor. The flash 313 may include, for example, a light emitting diode (LED) or a xenon lamp. In some embodiments, two or more lenses (an IR camera, a wide-angle lens, and a telephoto lens) and image sensors may be arranged on one surface of the electronic device 101. The camera modules 305, 312, and 313 are not limited to the above-described structure, and may be subject to various design modifications, such as mounting only some camera module or adding a new camera module, according to the structure of the electronic device 101.

According to an embodiment, the electronic device 101 may include a plurality of camera modules (e.g., a dual camera or a triple camera) each having a different property (e.g., FOV) or function. For example, a plurality of camera modules 305 and 312 including lenses with different FOVs may be configured, and the electronic device 101 may control to change the FOVs of the camera modules 305 and 312 implemented in the electronic device 101 based on a user selection. For example, at least one of the plurality of camera modules 305 and 312 may be a wide-angle camera, and at least another one may be a telephoto camera. Similarly, at least one of the plurality of camera modules 305 and 312 may be a front camera, and at least another one may be a rear camera. Additionally, the plurality of camera modules 305 and 312 may include at least one of a wide-angle camera, a telephoto camera, or an IR camera (e.g., a time of flight (TOF) camera or a structured light camera). According to an embodiment, the IR camera may operate as at least a portion of the sensor module. For example, the TOF camera may operate as at least a portion of a sensor module to detect the distance to a subject.

According to an embodiment, the key input devices 317 may be arranged on the side surfaces 310C of the housing 310. In another embodiment, the electronic device 101 may not include some or any of the key input devices 317, and the key input devices 317 which are not included may be implemented in other forms such as soft keys on the display 301. In some embodiments, the key input devices may include a sensor module disposed on the rear surface 310B of the housing 310.

According to an embodiment, the light emitting element may be disposed, for example, on the front surface 310A of the housing 310. The light emitting element may provide, for example, state information about the electronic device 101 in the form of light. In another embodiment, the light emitting element may provide, for example, a light source interworking with an operation of the front camera module 305. The light emitting element may include, for example, an LED, an IR LED, and/or a xenon lamp.

According to an embodiment, the connector holes 308 and 309 may include a first connector hole 308 capable of accommodating a connector (e.g., a USB connector) for transmitting and receiving power and/or data to and from an external electronic device and/or a second connector hole (e.g., an earphone jack) 309 capable of accommodating a connector for transmitting and receiving an audio signal to and from an external electronic device.

According to an embodiment, some camera modules 305 of the camera modules 305 and 312 and/or some sensor modules of the sensor modules may be disposed to be exposed to the outside through at least a portion of the display 301. For example, the camera module 305 may include a punch hole camera disposed inside a hole or recess formed on the rear surface of the display 301. According to an embodiment, the camera module 312 may be disposed inside the housing 310, such that a lens is exposed to the rear surface 310B of the electronic device 101. For example, the camera module 312 may be placed on a PCB (e.g., a PCB 340 of FIG. 4).

According to an embodiment, the camera module 305 and/or the sensor module may be disposed in contact with an external environment through a transparent area from the internal space of the electronic device 101 to the front plate 302 of the display 301. Additionally, some sensor module may be disposed to perform its function in the internal space of the electronic device, without being visually exposed through the front plate 302.

Figure 4:
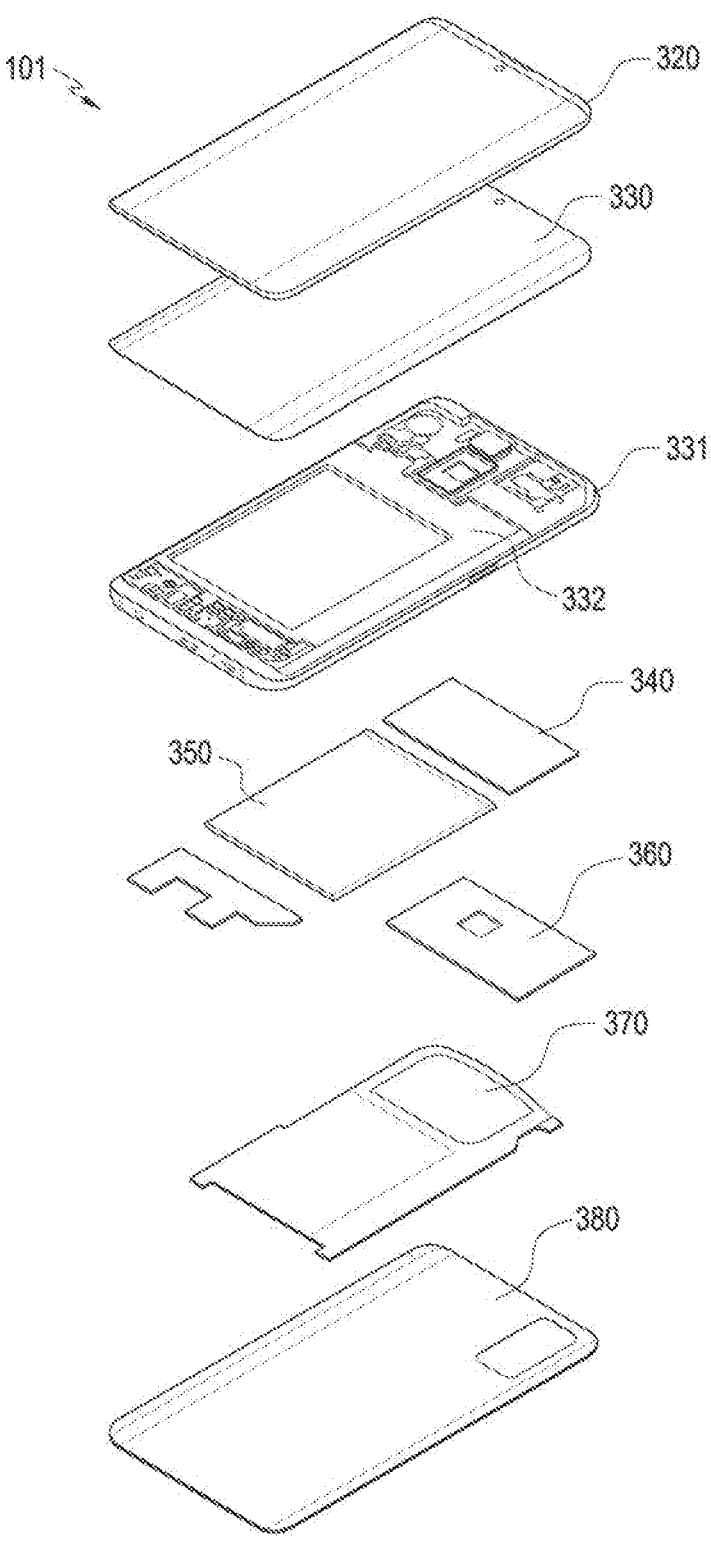
FIG. 4 is an exploded perspective view illustrating an electronic device according to various embodiments of the disclosure.

FIG. 4 is an exploded perspective view illustrating an electronic device according to various embodiments of the disclosure.

Referring to FIG. 4, the electronic device 101 (e.g., the electronic device 101 of FIGS. 1 to 3) according to various embodiments may include a side bezel structure 331 (e.g., the side bezel structure 318 of FIG. 2), a first support member 332, a front plate 320 (e.g., the front plate 302 of FIG. 2), a display 330 (e.g., the display 301 of FIG. 2), the PCB 340 (e.g., a PCB, a flexible PCB (FPCB), or a rigid flexible PCB (RFPCB)), a battery 350 (e.g., the battery 189 of FIG. 1), a second support member 360 (e.g., a rear case), an antenna 370 (e.g., the antenna module 197 of FIG. 1), and a rear plate 380 (e.g., the rear plate 311 of FIG. 2). In some embodiments, the electronic device 101 may not be provided with at least one (e.g., the first support member 332 or the second support member 360) of the components or may additionally include other components. At least one of the components of the electronic device 101 may be the same as or similar to at least one of the components of the electronic device 101 of FIG. 2 or FIG. 3, and a redundant description may be omitted herein.

According to various embodiments, the first support member 332 may be disposed within the electronic device 101 and connected to the side bezel structure 331, or may be integrally formed with the side bezel structure 331. The first support member 332 may be formed of, for example, a metal material and/or a non-metal (e.g., polymer) material. The first support member 332 may have one surface coupled with the display 330 and the other surface coupled with the PCB 340.

According to various embodiments, a processor, memory, and/or an interface may be mounted on the PCB 340. The processor may include at least one of, for example, a CPU, an AP, a GPU, an ISP, a sensor hub processor, or a CP. According to various embodiments, the PCB 340 may include a flexible PCB type radio frequency cable (FRC). For example, the PCB 340 may be disposed on at least a portion of the first support member 332 and electrically coupled to an antenna module (e.g., the antenna module 197 of FIG. 1) and a communication module (e.g., the communication module 190 of FIG. 1).

According to an embodiment, the memory (e.g., the memory 130 of FIG. 1) may include, for example, volatile memory or non-volatile memory.

According to an embodiment, the interface (e.g., the interface 177 of FIG. 1) may include, for example, a HDMI, a USB interface, an SD card interface, and/or an audio interface. The interface may electrically or physically connect the electronic device 101 to an external electronic device, for example, and include a USB connector, an SD card/MultiMediaCard (MMC) connector, or an audio connector.

According to various embodiments, the battery 350 (e.g., the battery 189 of FIG. 1), which is a device for supplying power to at least one component of the electronic device 101, may include, for example, a non-rechargeable primary cell, a rechargeable secondary cell, or a fuel cell. At least a portion of the battery 350 may be disposed substantially on the same plane as the PCB 340, for example. The battery 350 may be integrally disposed within the electronic device 101 or disposed detachably from the electronic device 101.

According to various embodiments, the second support member 360 (e.g., the rear case) may be disposed between the PCB 340 and the antenna 370. For example, the second support member 360 may include one surface coupled with at least one of the PCB 340 or the battery 350 and the other surface coupled with the antenna 370.

According to various embodiments, the antenna 370 (e.g., the antenna module 197 of FIG. 1) may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform sort-range communication with an external device or wirelessly transmit and receive power for charging to and from an external device. In another embodiment, an antenna structure may be formed by a portion or combination of the side bezel structure 331 and/or the first support member 332.

According to various embodiments, the rear plate 380 may form at least a portion of the rear surface (e.g., the rear surface 310B of FIG. 3) of the electronic device 101.

According to various embodiments, a filler may be applied to the PCB 340 to prevent problems caused by heating of components mounted on the PCB 340. For example, the filler may be a material with high heat transfer efficiency. Further, the filler may be a liquid-state or semi-solid state material. For example, the filler may include, but not limited to, a resin, a gel-type thermal interface material (TIM), and a solid-state TIM. In other words, the filler according to an embodiment may include any liquid-state or semi-solid state material and may refer to any member which may be disposed within the PCB 340 to perform a function of increasing the strength of the PCB 340 and dissipating heat of the PCB 340. According to various embodiments, the PCB 340 may be provided with a circuit board module 500 (see FIG. 5) to prevent backflow of a liquid-state filler during application of the filler.

In the following description, the circuit board module 500 (see FIG. 5) provided on the PCB 340 will be described with reference to the drawings.

Figure 5:
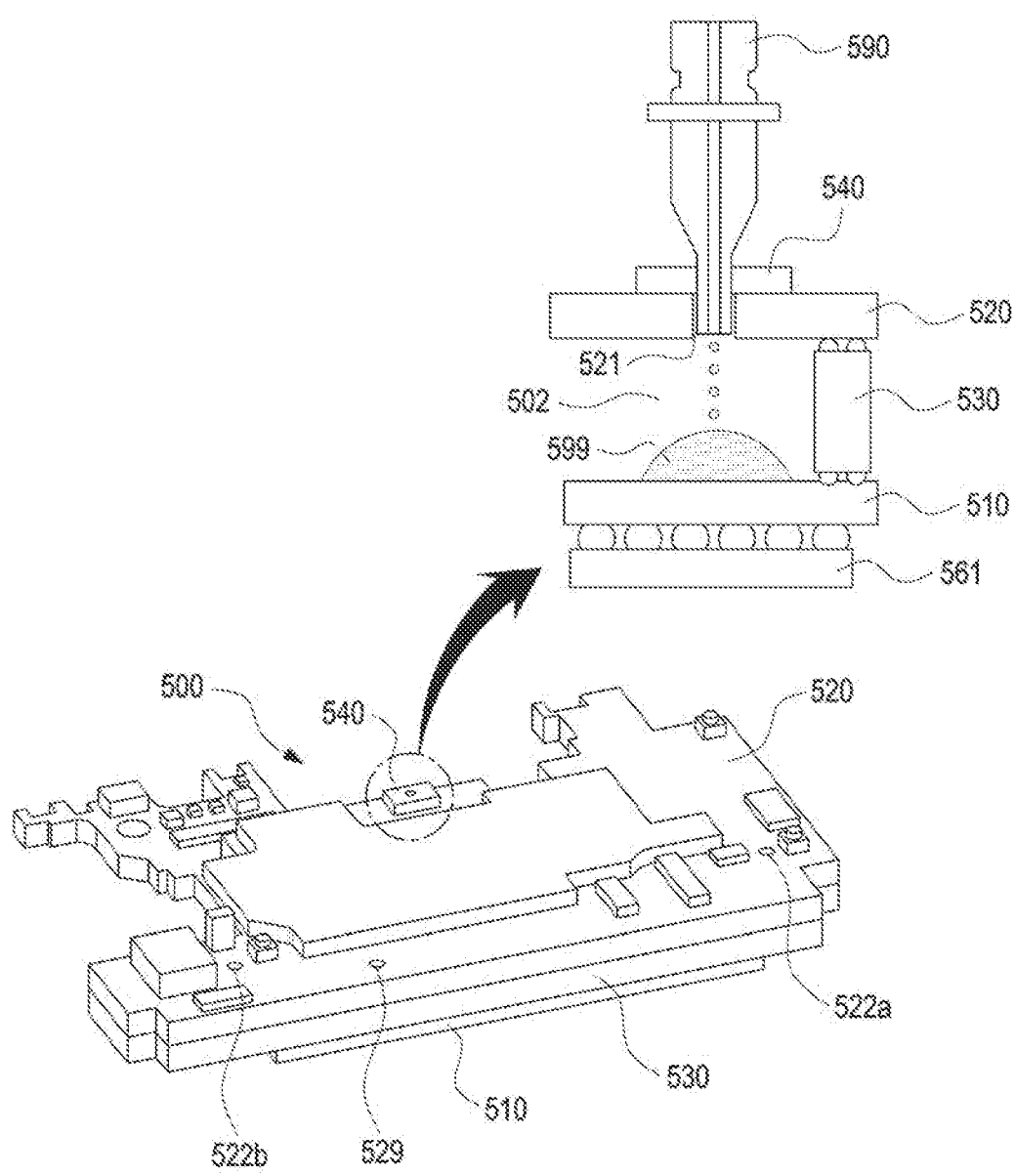
FIG. 5 is a diagram illustrating a circuit board module provided with a backflow prevention structure according to various embodiments of the disclosure.
Figure 6:
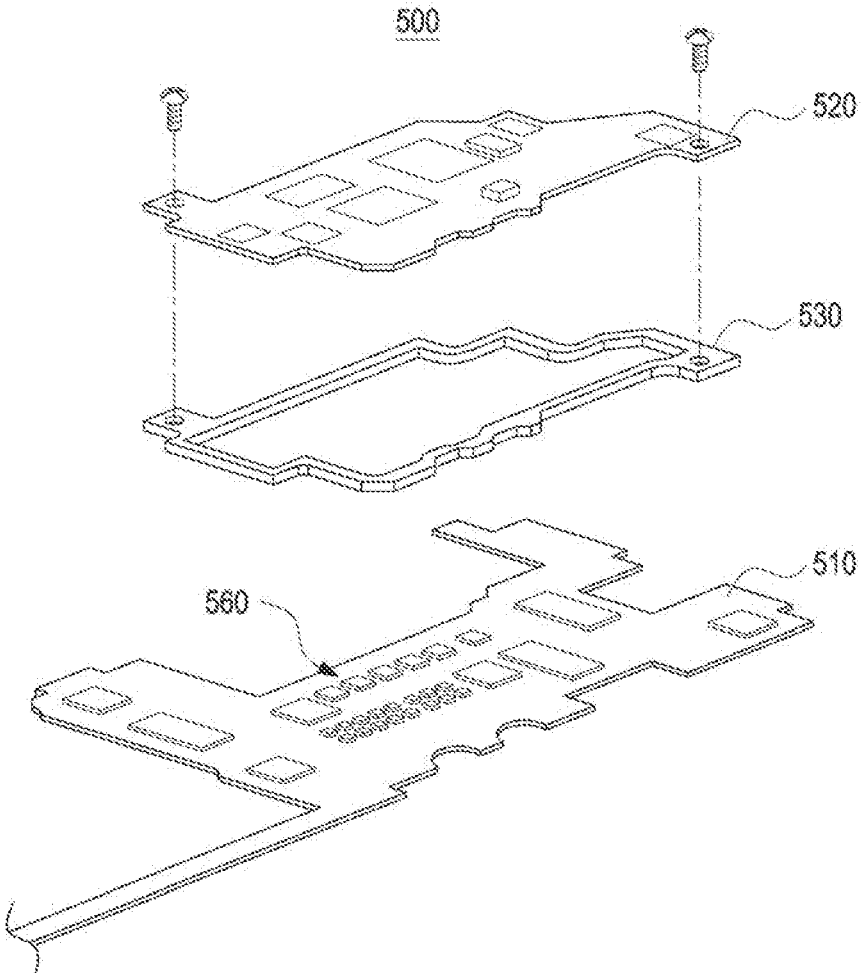
FIG. 6 is an exploded perspective view illustrating a circuit board module according to various embodiments of the disclosure.

FIG. 5 is a diagram illustrating a circuit board module provided with a backflow prevention structure according to various embodiments of the disclosure. FIG. 6 is an exploded perspective view illustrating a circuit board module according to various embodiments of the disclosure.

Referring to FIGS. 5 and 6, a structure for preventing backflow of a filler may be provided in the circuit board module 500. According to various embodiments, the circuit board module 500 may include a first substrate 510, a second substrate 520, an interposer 530 disposed between the first substrate 510 and/or the second substrate 520, and components 560 mounted on the first substrate 510 and/or the second substrate.

The circuit board module 500 of FIGS. 5 and 6 may be wholly or partially identical or similar to the PCB 340 of FIG. 4, and thus a redundant description may be omitted.

According to various embodiments, the circuit board module 500 may include a sealing member 540 and a plurality of openings 522a and 522b. All or some of the sealing member 540 and the plurality of openings 522a and 522b may be combined to provide the structure for preventing backflow of a filler.

According to various embodiments, the circuit board module 500 may include an inlet 521. For example, the inlet 521 may be formed on the second substrate 520. According to an embodiment, a nozzle 590 for injecting a filler may be inserted into the inlet 521. With the nozzle 590 inserted into the inlet 521, a filler 599 may be applied between the first substrate 510 and the second substrate 520.

According to various embodiments, the sealing member 540 may be disposed to cover all or a portion of the inlet 521. For example, the sealing member 540 may be attached to a top surface 520a (see FIG. 7) of the second substrate 520 to cover the inlet 521. The sealing member 540 may be attached to the top surface 520a (see FIG. 7) of the second substrate 520 by the surface mount technology (SMT) using a solder or adhesive. According to an embodiment, the nozzle 590 may penetrate both the sealing member 540 and the inlet 521 and apply the filler 599, while being inserted into the circuit board module 500. The sealing member 540 may cover the inlet 521 and prevent backflow of the applied filler 599.

According to various embodiments, some of the various components 560 mounted on the first substrate 510 and/or the second substrate 520 may be a heat source 561 that generates heat. For example, the heat source 561 may be at least one of a PMIC, a power amplifier (PAM), an AP, a CP, a charger integrated circuit (IC), a display driver integrated circuit (DDI), or a communication circuit (e.g., a transceiver, an active communication device, or a passive communication device).

According to various embodiments, the circuit board module 500 may include a first opening 522*a* and a second opening 522*b*. For example, the first opening 522*a* and the second opening 522*b* may be formed on the second substrate 520. However, this is an example, and the circuit board module 500 may include only one opening or three or more openings.

According to an embodiment, air may be introduced into at least one of the first opening 522*a* or the second opening 522*b*, and the introduced air may be exhausted out of the other opening. For example, the first opening 522*a* may be an intake opening and the second opening 522*b* may be an exhaust opening. Air introduced through the first opening 522*a* may flow within an internal space 502 of the circuit board module 500 and exit through the second opening 522*b*. As a result, the filler 599 applied to the internal space 502 may be applied more widely. For example, in a manufacturing process of the circuit board module 500, an application range of the filler 599 may be controlled by adjusting injection of external air through the first opening 522*a* and exhaust of internal air of the circuit board module 500 through the second opening 522*b*. This will be described in greater detail below.

According to an embodiment, all or some of the first opening 522*a* and/or the second opening 522*b* may provide an exhaust path for thermally expanded air from the internal space 502. For example, the first opening 522*a* and/or the second opening 522*b* may provide an exhaust path for thermally expanded air to prevent a situation in which air present within the internal space 502 may thermally expand and cause backflow of the filler 599.

According to various embodiments, the circuit board module 500 may include an inspection hole 529. For example, the inspection hole 529 may be formed on the second substrate 520. The inspection hole 529 according to an embodiment may provide a path through which an automated circuit board module manufacturing system may determine whether the filler 599 has been applied to a required area.

Figure 7:
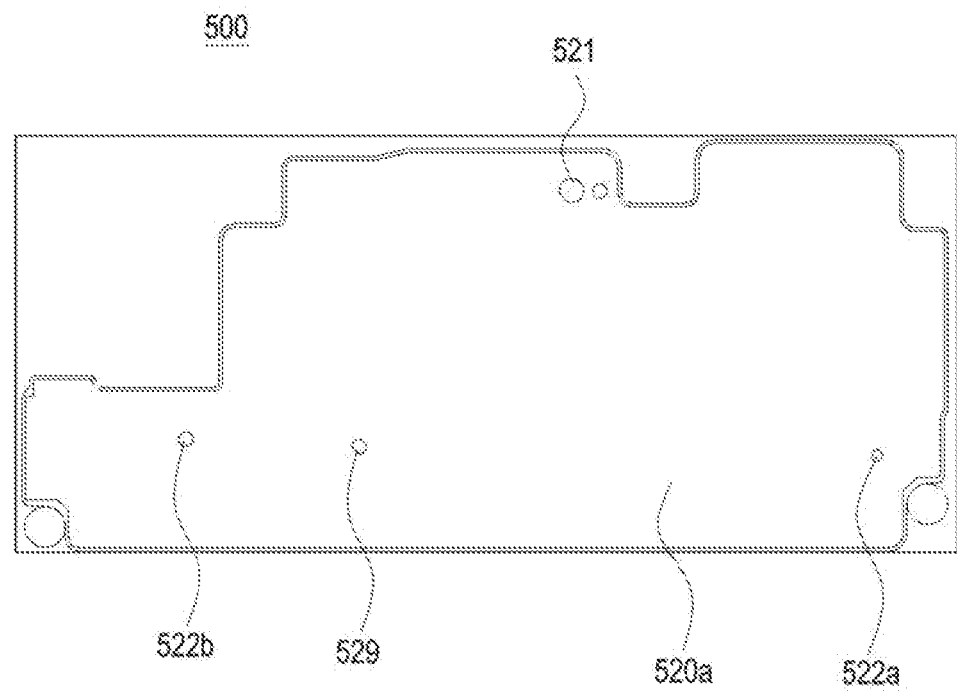
FIG. 7 is a top view illustrating a circuit board module according to various embodiments of the disclosure.
Figure 8:
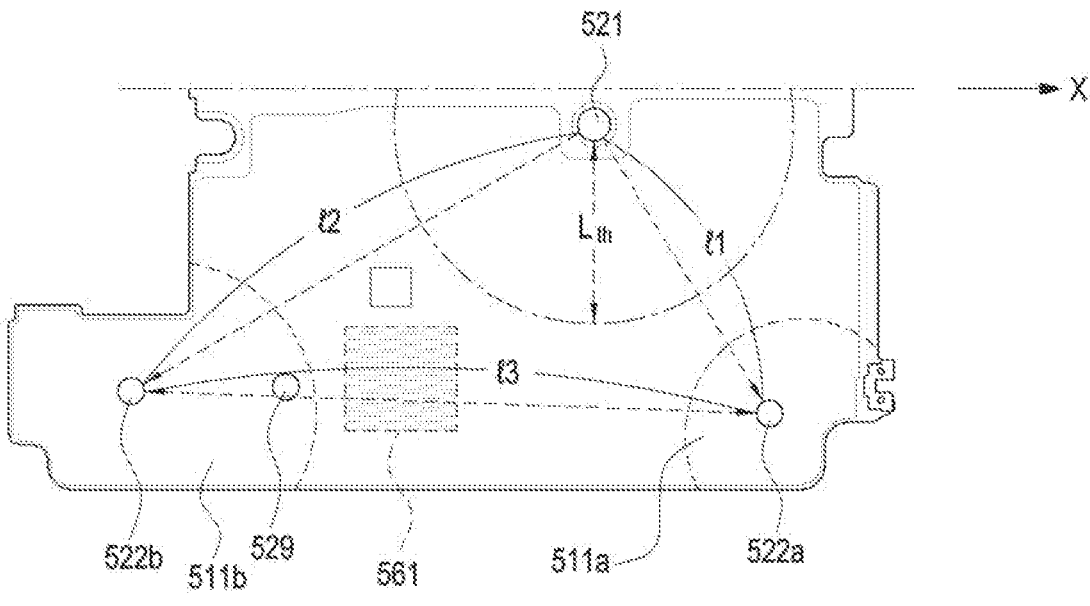
FIG. 8 is a projection view illustrating a circuit board module as viewed from above according to various embodiments of the disclosure.
Figure 9:
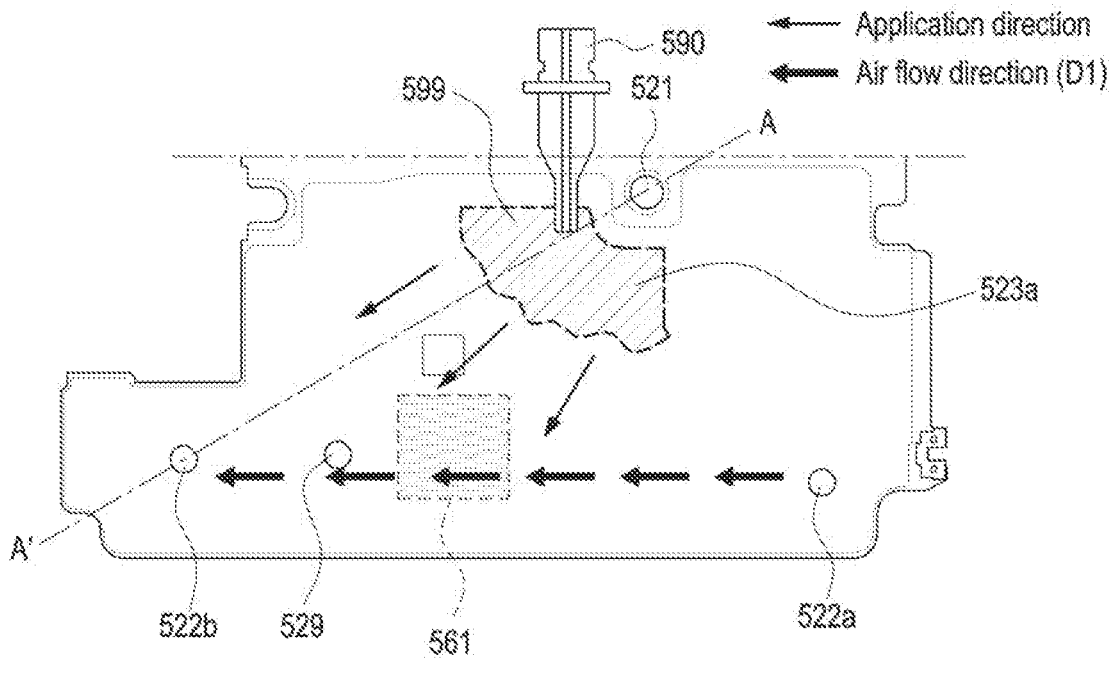
FIG. 9 is a perspective view illustrating partial application of a filler into the circuit board module of FIG. 8 according to various embodiments of the disclosure.
Figure 10:
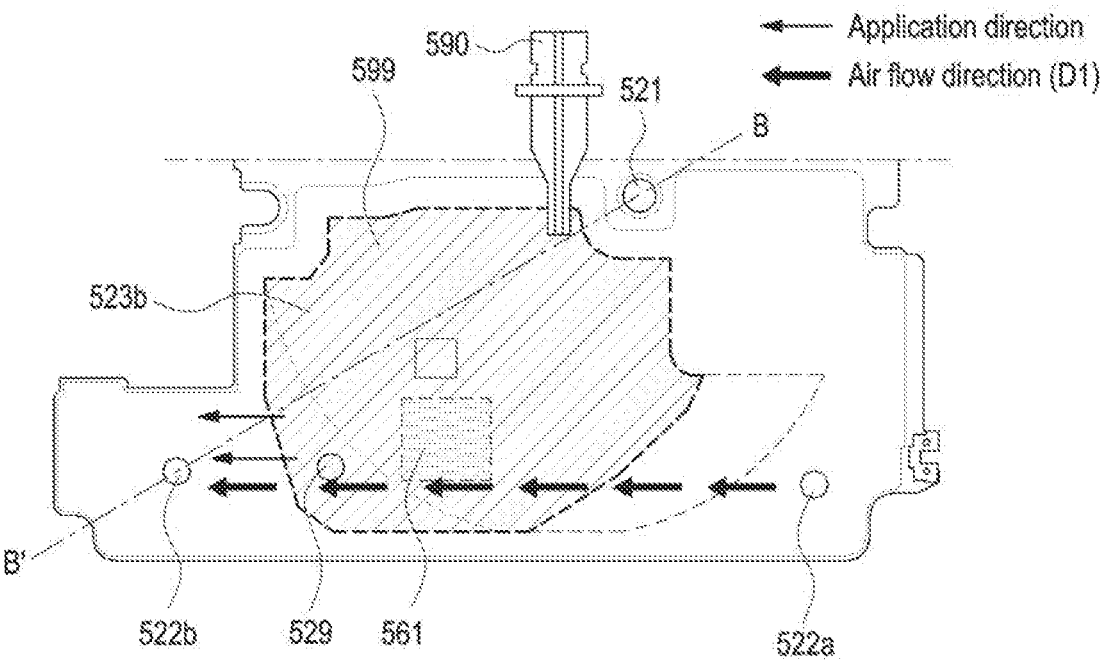
FIG. 10 is a perspective view illustrating full application of a filler into the circuit board module of FIG. 8 according to various embodiments of the disclosure.
Figure 11:
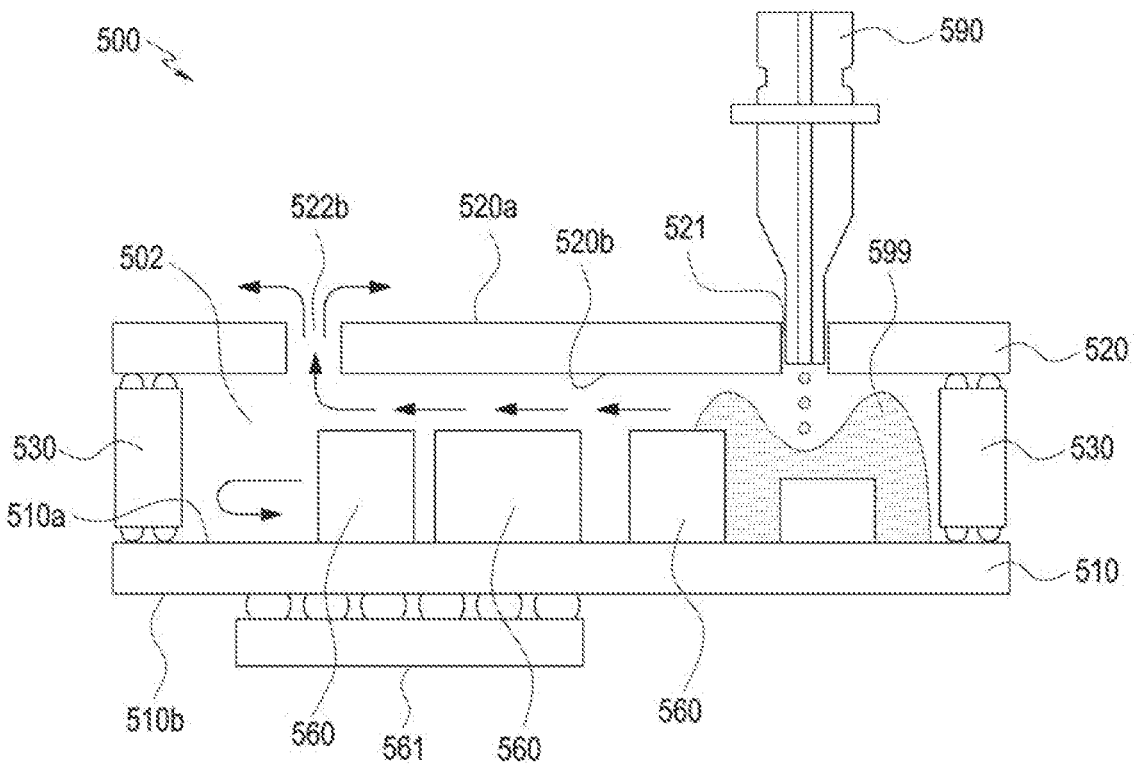
FIG. 11 is a cross-sectional view taken along line A-A' of FIG. 9 according to various embodiments of the disclosure.
Figure 12:
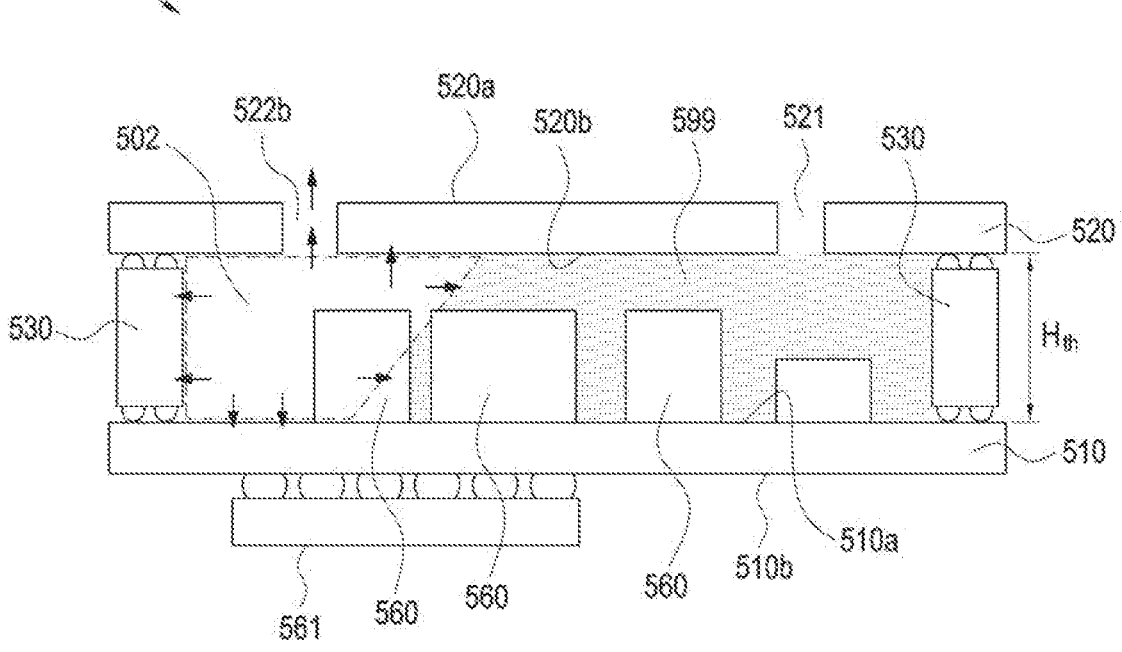
FIG. 12 is a cross-sectional view taken along line B-B' of FIG. 10 according to various embodiments of the disclosure.

FIG. 7 is a top view illustrating a circuit board module according to various embodiments of the disclosure. FIG. 8 is a projection view illustrating a circuit board module as viewed from above according to various embodiments of the disclosure. FIG. 9 is a perspective view illustrating partial application of a filler into the circuit board module of FIG. 8 according to various embodiments of the disclosure. FIG. 10 is a perspective view illustrating full application of a filler into the circuit board module of FIG. 8 according to various embodiments of the disclosure. FIG. 11 is a cross-sectional view taken along line A-A' of FIG. 9 according to various embodiments of the disclosure. FIG. 12 is a cross-sectional view taken along line B-B' of FIG. 10 according to various embodiments of the disclosure.

Referring to FIGS. 7 to 12, air entering or exiting from the plurality of openings 522*a* and 522*b* may adjust a direction of application of the filler 599. The circuit board module 500 of FIGS. 7 to 12 may be wholly or partially identical or similar to the circuit board module 500 of FIGS. 5 and 6, and thus a redundant description may be omitted.

Referring to FIGS. 7 and 8, a distance between the inlet 521 and the first opening 522*a* and a distance between the inlet 521 and the second opening 522*b* may be set to be equal to or greater than a threshold distance Lth. When the distance between the inlet 521 through which the filler 599 is injected and the first opening 522*a* or the second opening 522*b* is equal to or less than the threshold distance Lth, the filler 599 may flow back through the first opening 522*a* or the second opening 522*b*. According to an embodiment, the first opening 522*a* and/or the second opening 522*b* may be disposed to be spaced apart from the inlet 521 by the threshold distance Lth or more, thereby preventing the filler 599 from flowing back through the first opening 522*a* and/or the second opening 522*b*. In other words, the threshold distance Lth may refer to a minimum distance at which the filler 599 does not flow back through the first opening 522*a* and/or the second opening 522*b* during a process of injecting the filler 599. According to an embodiment, the threshold distance Lth may be determined by at least one or a combination of some of an injection rate, an injection time, and/or an injection volume of the filler 599 discharged from the nozzle 590. According to an embodiment, the first opening 522*a* may be spaced apart from the inlet 521 by a first distance 11 equal to or greater than the threshold distance Lth. Further, the second opening 522*b* may be spaced apart from the inlet 521 by a second distance 12 equal to or greater than the threshold distance Lth. Further, according to an embodiment, the distance between the inlet 521 and the first opening 522*a* or the distance between the inlet 521 and the second opening 522*b* may be less than the distance between the first opening 522*a* and the second opening 522*b*.

According to various embodiments, the first opening 522*a* and/or the second opening 522*b* may be formed within specific respective areas of the second substrate 520. For example, the first opening 522*a* may be formed on the second substrate 520 at a position corresponding to a first area 511*a*. Additionally, the second opening 522*b* may be formed on the second substrate at a position corresponding to a second area 551*b*. For example, the first area 511*a* and the second area 511*b* may refer to areas on the first substrate 510, in which no filler is required to be applied after the filler injection is completed. Alternatively, the first area 511*a* and the second area 551*b* may refer to areas in which air is thermally expanded by the heat source 561 or by curing of the filler 599. As the first opening 522*a* and/or the second opening 522*b* are formed at the position corresponding to the first area 511*a* and/or the second area 511*b*, air from the overheated internal space 502 may be discharged to the outside.

According to various embodiments, the heat source 561 may be disposed between the first opening 522*a* and the second opening 522*b* in a direction of a first axis (x axis) (see FIG. 8). The heat source 561 may be disposed on a top surface 510*a* or a bottom surface 510*b* of the first substrate 510. For example, the first axis may refer to a longitudinal axis of the circuit board module 500. According to an embodiment, the filler 599 may be applied along a direction corresponding to a direction of an air flow in the internal space 502. For example, air entering the first opening 522*a* may flow in a direction corresponding to a direction from the first opening 522*a* to the second opening 522*b*. As a result, when the heat source 561 is disposed between the first opening 522a and the second opening 522b in the direction of the first axis (x axis), the filler 599 may be applied to an area corresponding to the heat source 561.

According to various embodiments, the inspection hole 529 may be formed between the first opening 522a and the second opening 522b. According to an embodiment, the inspection hole 529 may be formed near a boundary of the second area 551b. For example, the automated circuit board module manufacturing system may include various imaging devices (e.g., a camera) or various distance sensors (e.g., an IR sensor) and determine whether the filler 599 has been applied to a required area, using the inspection hole 529. Similarly to the case of the second area 511b, the inspection hole 529 may of course be formed near a boundary of the first area 511a. While imaging devices and distance sensors have been described as an example, it will be understood that a variety of sensors may be used to identify the application of the filler 599 through the inspection hole 529.

Referring to FIGS. 9 and 10, a process of applying the filler 599 to the internal space 502 is illustrated.

When the filler 599 is injected from the nozzle 590, the filler 599 may initially be deposited over a first application area 523a, which is an area near the inlet 521. When the filler 599, which is a highly viscous material, is applied to the first application area 523a near the inlet 521, it may be necessary to cause a flow of the filler 599 such that the filler 599 is applied over a desired area.

According to various embodiments, air through the first opening 522a and the second opening 522b may induce the flow of the filler 599. For example, when air introduced through the first opening 522a travels in a first direction D1 and exits through the second opening 522b, the application area of the filler 599 may also change to correspond to the first direction D1. According to an embodiment, the filler 599 applied to the first application area 523a may flow in a direction corresponding to the first direction D1 by air traveling in the first direction D1 and be applied to a second application area 523b. According to an embodiment, the second application area 523b may refer to an area to which the filler 599 is applied, as may be required by various industry standards. According to an embodiment, the second application area 523b may be predetermined according to industry standards. For example, the second application area 523b may be determined so as to overlap an area corresponding to the heat source 561. In another example, the second application area 523b may be determined such that it is not disposed under the first opening 522a and/or the second opening 522b. In another example, the second application area 523b may be determined in consideration of an injection amount or injection time of the filler 599 in the manufacturing process. However, this is an example, and it will be understood that the second application area 523b may be determined by the above examples in combination or by other industry requirements.

According to an embodiment, an air flow in the internal space 502 may be controlled by closing or opening all or a portion of the first opening 522a and/or the second opening 522b. For example, the filler 599 may be induced to flow in a direction in which the first opening 522a is disposed by closing the second opening 522b and opening only the first opening 522a.

According to various embodiments, the position of the first opening 522a and/or the second opening 522b may be determined to ensure that the filler 599 is applied to an area corresponding to the heat source 561 among areas of the top surface 510a (see FIGS. 11 and 12) of the first substrate 510. Further, the direction of the air flow within the internal space 502 may be determined through the first opening 522a and/or the second opening 522b. The positions of the first opening 522a and the second opening 522b may also be determined such that the filler 599 may be applied onto the various components 560 disposed on the top surface 510a (see FIGS. 11 and 12) of the first substrate 510 as well as the area corresponding to the heat source 561.

According to various embodiments, in the manufacturing process of the circuit board module 500, a process performing entity may introduce air through the first opening 522a in response to the injection of the filler 599. For example, the process performing entity may be an automated circuit board module manufacturing system or a human, and the following description will focus on an automated circuit board module manufacturing system for ease of description. The process of applying the filler 599 by air introduced through the first opening 522a is similar to that described above. According to an embodiment, in the manufacturing process of the circuit board module 500, the process performing entity may determine through the inspection hole 529 whether the filler 599 has been applied over a required area. For example, the circuit board module manufacturing system may use an imaging device or a distance sensor to determine whether the filler 599 has been applied at a position corresponding to the inspection hole 529. According to an embodiment, the inspection hole 529 may be located near the boundary of the second application area 523b. For example, the inspection hole 529 may be formed on an inward side of the second application area 523b adjacent to the boundary of the second application area 523b, and the circuit board module manufacturing system may determine, through an imaging device or a distance sensor, whether the filler 599 has been applied to the vicinity of the boundary of the second application area 523b. According to an embodiment, the circuit board module manufacturing system may stop injecting the filler 599 and/or introducing air when determining that the filler 599 has been applied up to the area corresponding to the inspection hole 529, or continue injecting the filler 599 and/or introducing air when determining that the filler 599 has not been applied up to the area corresponding to the inspection hole 529.

Referring to FIGS. 11 and 12, a process of injecting the filler 599 into the circuit board module 500 is illustrated in a cross-sectional view of the circuit board module 500.

According to various embodiments, the first opening 522a (see FIG. 7) and the second opening 522b may adjust the pressure of the internal space 502. For example, due to curing of the filler 599, a high temperature environment such as 130 to 140° C. may be created within the internal space 502. According to an embodiment, in the internal space 502 where a high temperature environment is created, air may expand or gas may be generated from the filler 599 in the internal space 502, causing the filler 599 to flow back to the inlet 521. According to an embodiment, the first opening 522a and/or the second opening 522b may prevent the pressure within the internal space 502 from increasing during the curing of the filler 599. For example, the first opening 522a and/or the second opening 522b may provide a path through which the expanded air may escape from the internal space 502 in the high temperature environment. In another example, the first opening 522a and/or the second opening 522b may provide a path through which gases generated from the filler 599 may exit during the curing operation.

According to various embodiments, the filler 599 may be disposed to be deposited to or below a predetermined height Hth within the internal space 502. For example, the predetermined height Hth may refer to a height from the top surface 510a of the first substrate 510 to a bottom surface 520b of the second substrate 520. For example, the deposition height of the filler 599 may be adjusted by adjusting the pressure within the internal space 502 through the first opening 522a and/or the second opening 522b, as described above. In another example, the filler 599 may be applied to be located between the top surface 510a of the first substrate 510 and a top surface 520a of the second substrate 520 (or a top end of the inlet 521).

Figure 13:
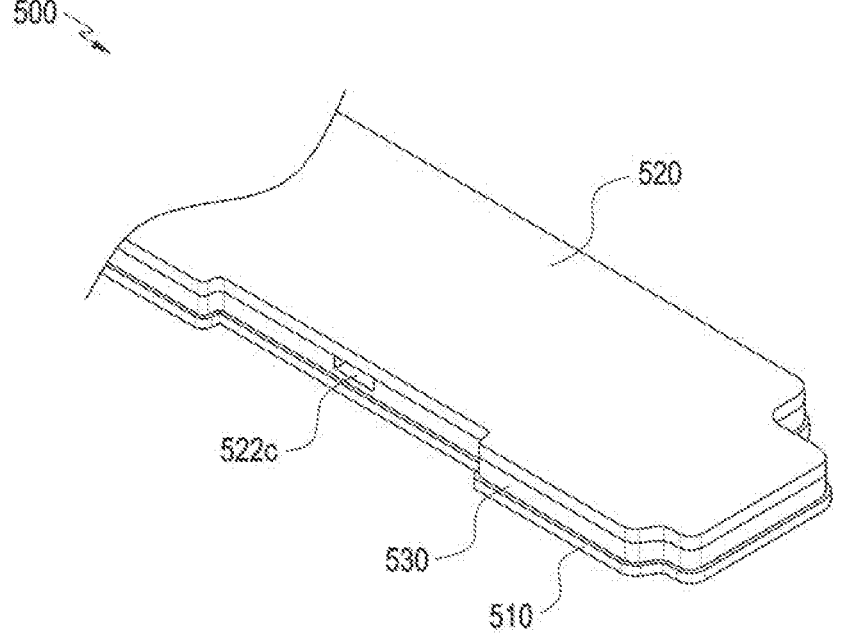
FIG. 13 is a diagram illustrating a circuit board module according to various embodiments of the disclosure.

FIG. 13 is a diagram illustrating a circuit board module according to various embodiments of the disclosure.

Referring to FIG. 13, the circuit board module 500 may include a third opening 522c. The circuit board module 500 of FIG. 13 is wholly or partially identical or similar to the circuit board module 500 of FIG. 5, and thus a redundant description may be omitted.

According to various embodiments, the third opening 522c may be formed on the interposer 530. The third opening 522c may provide the same function as the first opening 522a and/or the second opening 522c described above. According to an embodiment, the third opening 522c may be formed together with at least some or all of the first opening 522a and/or the second opening 522c. For example, the first opening 522a may be formed on the second substrate 520, and the third opening 522c may be formed on the interposer 530. According to an embodiment, a plurality of third openings 522c may be formed on the interposer 530. For example, some of the plurality of third openings 522c formed on the interposer 530 may perform a function similar to the first opening 522a, and others may perform a function similar to the second opening 522b. According to various embodiments, the third opening 522c may be used as an inlet for insertion of the nozzle 590.

In the following description herein, exemplary sealing members according to various embodiments will be described with reference to the drawings.

Figure 14:
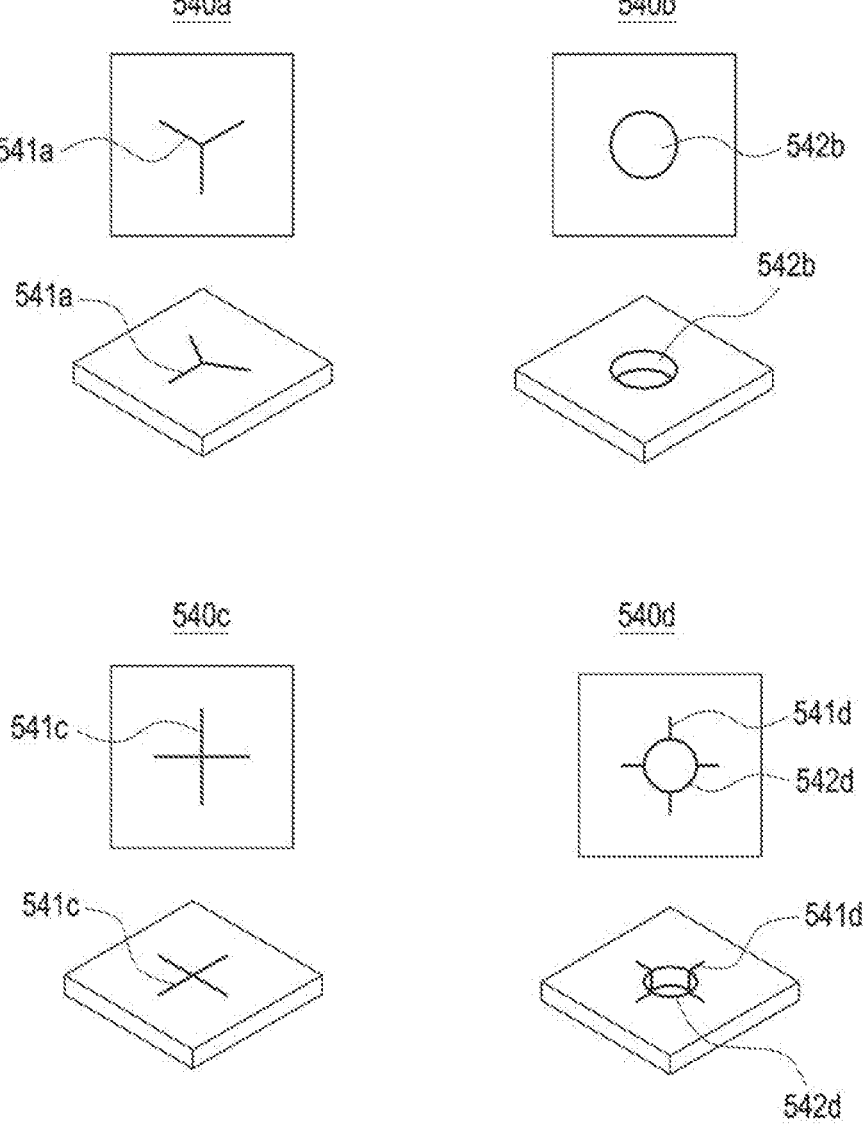
FIG. 14 is a diagram illustrating insertion areas of sealing members according to various embodiments of the disclosure.

FIG. 14 is a diagram illustrating insertion areas of sealing members according to various embodiments of the disclosure.

Referring to FIG. 14, various sealing members are depicted. The sealing member 540a may include insertion area 541a, the sealing member 540b may include insertion area 541b, the sealing member 540c may include insertion area 541c and the sealing member 540d may include insertion area 541d. The sealing members 540a-540d of FIG. 14 may be wholly or partially identical or similar to the sealing member 540 of FIG. 5, and thus a redundant description may be omitted.

According to various embodiments, the insertion areas 541a, 541b, 541c, and 541d may be formed near a center area of the corresponding sealing member 540a to 540d. According to an embodiment, an insertion area may provide a path through which the nozzle 590 is inserted into the inlet 521.

According to various embodiments, the insertion areas 541a and 541c may be provided in the form of slits. According to an embodiment, the insertion areas 541a and 541c may vary in area in response to an external force. For example, the insertion areas 541a and 541c may maintain a substantially gap-free shape when no external force is applied, and may be widened to create a space for insertion of the nozzle when an external force is applied. According to an embodiment, the sealing members 540a and 54c may include an elastic, resilient material (e.g., rubber) such that when the insertion areas 541a and 541c are formed in the form of slits, they may be changed in shape upon application of an external force and return to their original shapes after the application of the external force ends. As the insertion areas 541a and 541c are formed as slits, the nozzle 590 may be inserted, and after completion of application of the filler 599, the shapes of the insertion areas 541a and 541c may be restored, thereby preventing backflow of the filler 599. According to an embodiment, the insertion areas 541a and 541c may be formed by allowing a thin blade to penetrate therethrough or by etching a portion of the sealing members 540a and 540c. However, this is an example, and the slit-shaped insertion areas 541a and 541c may be formed in various manners.

According to various embodiments, the slit-shaped insertion areas 541a and 541c may have a symmetrical shape. In an example, the insertion area 541c may be cross-shaped. In another example, the insertion area 541a may be Y-shaped. As the slit-shaped insertion areas 541a and 541c have a symmetrical shape, insertion of the nozzle 590 may be facilitated or deformation of the insertion areas 541a and 541c may be minimized during removal of the nozzle 590.

According to various embodiments, the sealing member 540b may include an insertion opening 542b. The insertion opening 542b may be formed in the center area of the sealing member 540b. According to an embodiment, the insertion opening 542b may be circular. However, the insertion opening 542b may have a polygonal shape, not limited to a circle, and various other shapes are available, which provide an insertion path for the nozzle 590. According to an embodiment, the width of the insertion opening 542b may be less than the width of a distal end of the nozzle 590. As a result, the nozzle 590 and the insertion opening 542b may be brought into close contact during injection of the filler 599. For example, when the sealing member 540b is formed of an elastic material, the insertion opening 542b may expand upon insertion of the nozzle, and the insertion opening 542b and the nozzle 590 may be brought into close contact by an elastic force that restores the expanded insertion opening 542b.

According to various embodiments, a sealing member 540d may include a slit-shaped insertion area 541d and an insertion opening 542d. According to an embodiment, the insertion area 541d may be formed around the insertion opening 542d. Alternatively, centered on the insertion opening 542d, the insertion area 541d may be formed to surround the insertion opening 542d. According to an embodiment, the insertion opening 542d and the insertion area 541d may be formed to be connected. The description of the insertion area 541d and the insertion opening 542d may be adapted from the description of the insertion areas 541a and 541c and the insertion opening 542b described above.

Figure 15:
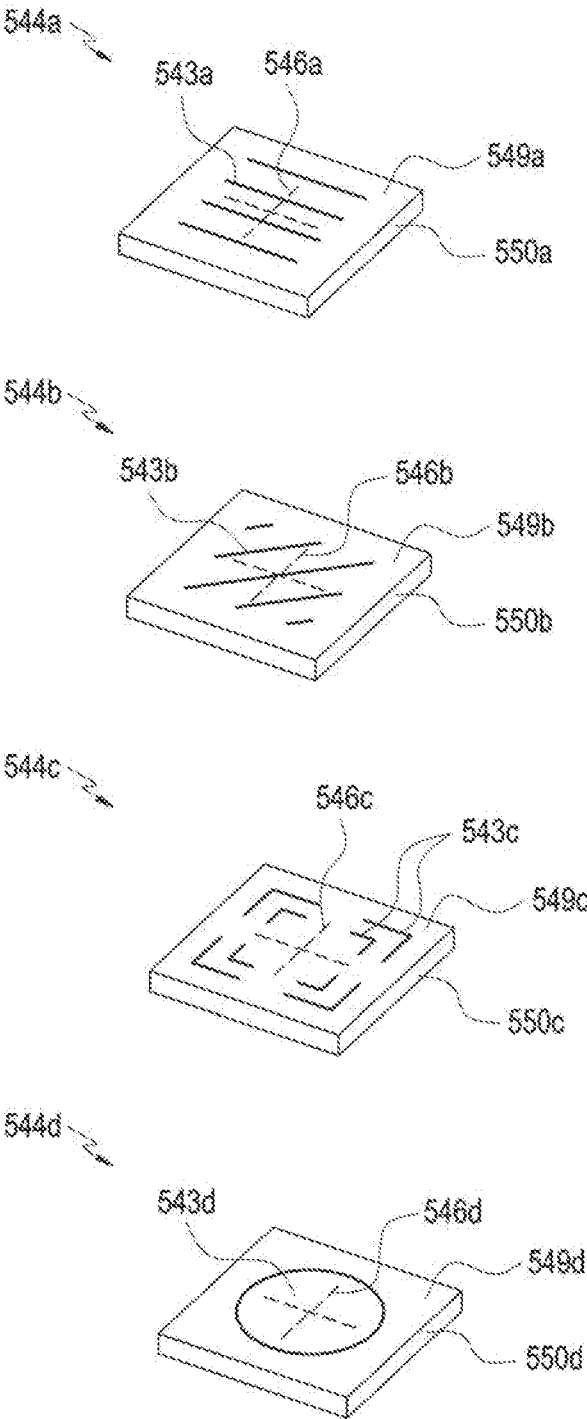
FIG. 15 is a diagram illustrating deformation-resistant areas of a sealing member according to various embodiments of the disclosure.

FIG. 15 is a diagram illustrating deformation-resistant areas of a sealing member according to various embodiments of the disclosure.

Referring to FIG. 15, sealing members 544a to 544d are depicted. The sealing members 544a to 544d may respectively include an adhesive layer 549a to 549d, a sealing layer 550a to 550d, insertion areas 546a to 546d and deformation-resistant areas 543a to 543d. The sealing members of FIG. 15 may be wholly or partially identical or similar to the sealing members described above, and thus a redundant description may be omitted.

According to various embodiments, the adhesive layer may form an outer layer of the sealing member and be bonded (e.g., SMT using a solder) to a circuit board (e.g., the first substrate 510 and/or the second substrate 520 of FIG. 4). The sealing layer may be located under the adhesive layer and include an elastic material. According to an embodiment, the adhesive layer and the sealing layer may be formed of materials having different thermal expansion coefficients or the same material.

According to various embodiments, a deformation-resistant area may be formed around an insertion area or an insertion opening. For example, the deformation-resistant area may be formed by removing or etching a portion of the adhesive layer in an area adjacent to the insertion area or the insertion opening to prevent deformation of the insertion area and/or the insertion opening. As a result, deformation of the sealing member caused by the difference between the thermal expansion coefficients of the adhesive layer and the sealing layer may be reduced in a process of attaching the sealing member to the circuit board module.

According to various embodiments, the deformation-resistant area 543a may be formed on the adhesive layer 549a in a horizontal or vertical direction relative to the shape of the sealing member 544a. For example, when the sealing member 544a has a square shape, the deformation-resistant area 543a may be formed by etching a portion of the adhesive layer 549a in the horizontal or vertical direction to cover all or a portion of the insertion area 546a.

According to various embodiments, the deformation-resistant area 543b may be formed on the adhesive layer 549b in a diagonal direction relative to the shape of the sealing member 544b. For example, when the sealing member 544b has a square shape, the deformation-resistant area 543b may be formed by etching a portion of the adhesive layer 549b in the diagonal direction to cover all or a portion of the insertion area 546b. Further, the deformation-resistant area 543b may be formed in a center area of the adhesive layer 549b.

According to various embodiments, the deformation-resistant area 543c may be formed to be bend-shaped on the adhesive layer 549c. The bend shape may include a gently curved shape and a sharply curved shape (e.g., L-shaped). According to an embodiment, the deformation-resistant area 543c may be bend-shaped around the insertion area 546c and located on an outer portion of the adhesive layer 549c (e.g., near each vertex of the sealing member 546c) in the bend shape, and the insertion area 546c may be formed between a plurality of deformation-resistant areas 543c.

According to various embodiments, the deformation-resistant area 543d may be formed by removing a partial area of the adhesive layer 549d corresponding to the insertion area 546d. According to an embodiment, the deformation-resistant area 543d may be formed to include all or a portion of the insertion area 546d. For example, the deformation-resistant area 543d may be an opening in which a portion of the adhesive layer 546d and/or the sealing layer 550d is removed to include the insertion area 546d. According to an embodiment, the deformation-resistant area 543d may be, but not limited to, a circular area, and may be formed as a square area or various polygonal areas.

Figure 16:
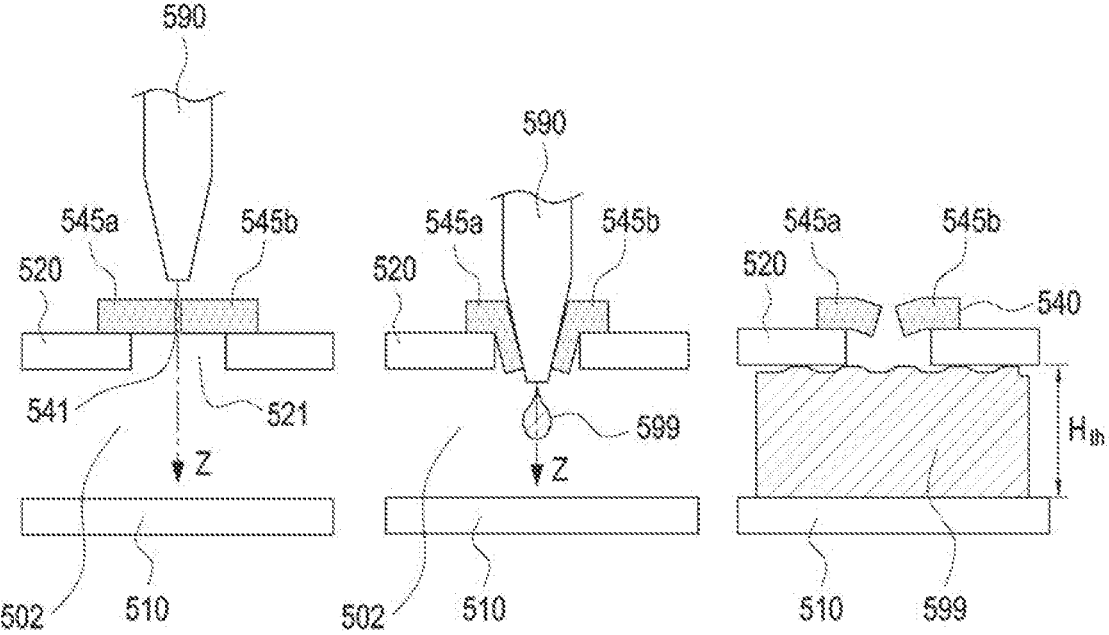
FIG. 16 is a cross-sectional view illustrating a process of injecting a filler through a sealing member according to various embodiments of the disclosure.

FIG. 16 is a cross-sectional view illustrating a process of injecting a filler through a sealing member according to various embodiments of the disclosure. The circuit board module of FIG. 16 may be wholly or partially identical or similar to the circuit board module 500 of FIG. 5, and the sealing member 540 of FIG. 16 may be wholly or partially identical or similar to the sealing member 540 of FIGS. 14 and 15. Therefore, a redundant description may be omitted.

Referring to FIG. 16, the nozzle 590 may be inserted into the internal space 502 through the sealing member 540.

According to various embodiments, the nozzle 590 may be inserted in a vertical direction (z-axis direction) of the circuit board module 500 through the insertion area 541. According to an embodiment, the nozzle 590 may be inserted into the internal space 502 while pressing a first pressed area 545a and a second pressed area 545b adjacent to the insertion area 541. For example, when the nozzle 590 presses the first pressed area 545a and the second pressed area 545b, the first pressed area 545a and the second pressed area 545b may be deformed in the Z-axis direction, and the insertion area 541 may expand to allow the nozzle 590 to be inserted into the internal space 502. According to an embodiment, the nozzle 590 may apply the filler 599 onto the first substrate 510, while being inserted into the internal space 502.

According to various embodiments, after the nozzle 590 is removed from the insertion area 541, the shape of the sealing member 540 may be restored. In an example, as described above, the insertion area 541 may be formed in the form of a slit such that the first pressed area 545a and the second pressed area 545b may contact each other once pressure applied by the nozzle 590 is released. Accordingly, the sealing member 540 may prevent backflow of the filler 599. According to an embodiment, as the backflow of the filler 599 is prevented, the filler 599 may be located only in the internal space 502, and, for example, the filler 599 may be deposited to or below the predetermined height Hth described above.

Figure 17:
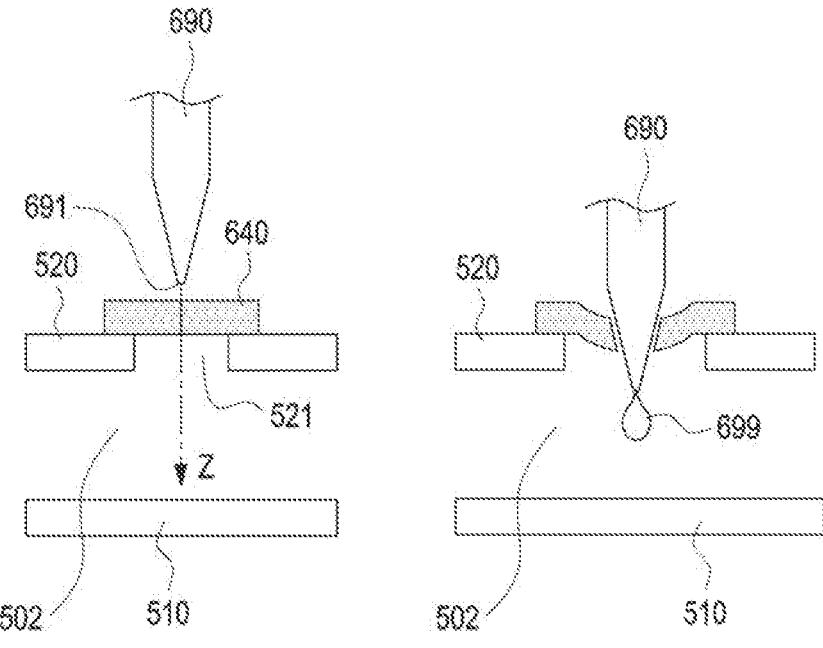
FIG. 17 is a cross-sectional view illustrating a nozzle and a process of injecting a filler through the nozzle according to various embodiments of the disclosure.

FIG. 17 is a cross-sectional view illustrating a nozzle and a process of injecting a filler through the nozzle according to various embodiments of the disclosure.

Referring to FIG. 17, a nozzle 690 may be inserted into the internal space 502, penetrating at least a portion of a sealing member 640. The sealing member 640 according to an embodiment may not separately include an insertion area. The circuit board module 500 of FIG. 17 may be wholly or partially identical or similar to the circuit board module 501 of FIG. 5, and thus a redundant description may be omitted.

According to various embodiments, the nozzle 690 may have a sharply formed end 691. The sharply formed end 691 may penetrate the sealing member 640 and be inserted into the internal space 502. The nozzle 690, which has penetrated the sealing member 640 and has been inserted into the internal space 502, may apply the filler 599.

Figure 18A:
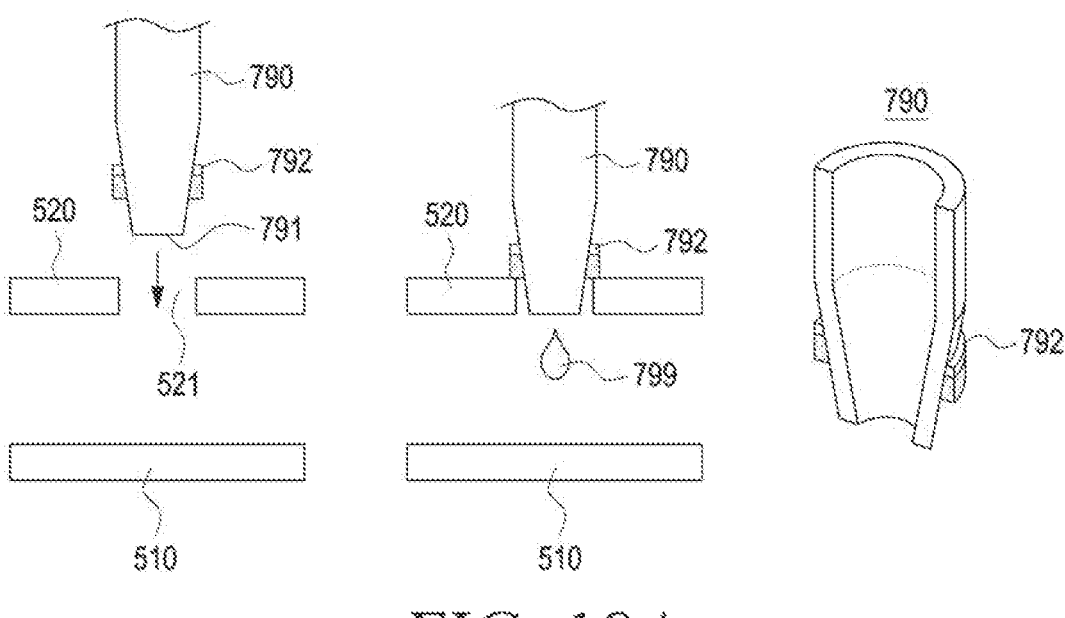
FIGS. 18A and 18B are a cross-sectional views illustrating a nozzle with a sealing member and a process of injecting a filler through the nozzle according to various embodiments of the disclosure.
Figure 18B:
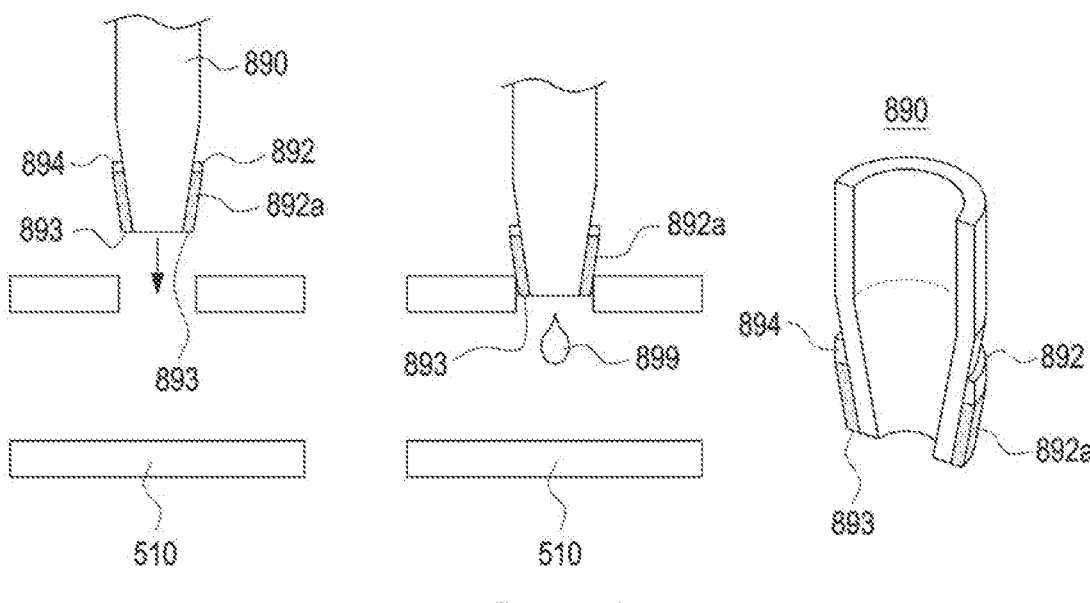

FIGS. 18A and 18B are a cross-sectional views illustrating a nozzle with a sealing member and a process of injecting a filler through the nozzle according to various embodiments of the disclosure.

Referring to FIGS. 18A and 18B, nozzles 790 and 890 may include sealing members 792 and 892. The circuit board module of FIGS. 18A and 18B may be wholly or partially identical or similar to the circuit board module 500 of FIG. 5, and thus a redundant description may be omitted.

According to various embodiments, although the sealing members 792 and 892 may be included in a portion (e.g., the inlet 521 of the second substrate 520) of the circuit board module as described above, they may also be included in the nozzles 790 and 890. According to an embodiment, the sealing members 792 and 892 may be disposed on one side of the nozzles 790 and 890 (e.g., near inlets of the nozzles). According to an embodiment, the sealing members 792 and 892 disposed on the nozzles 790 and 890 may be combined with the inlet 521 to seal the inlet 521 of fillers 799 and 899.

According to various embodiments, referring to FIG. 18A, the sealing member 792 may have a tube shape. For example, the sealing member 792 may be formed to surround a portion of the nozzle 790 in the horizontal direction. According to an embodiment, the sealing member 792 may be disposed near an end 791 of the nozzle 790. For example, the sealing member 792 may be disposed above the end 791 of the nozzle 790, such that the end 791 is insertable into the internal space 502. According to an embodiment, the width of the sealing member 792 may be formed to be larger than the width of the inlet 521 in order to seal the inlet 521.

According to various embodiments, referring to FIG. 18B, the sealing member 892 may have a tapered shape. For example, the sealing member 892 may have a shape that gradually narrows from a top end 894 toward a bottom end 893. Further, the sealing member 892 may have a shape corresponding to the shape of the nozzle 890. According to an embodiment, the bottom end 893 of the sealing member 892 may be formed to have a width less than the width of the inlet 521 to allow at least a portion of the nozzle 890 to be inserted into the inlet 521. According to an embodiment, the top end 894 of the sealing member 892 may be formed to have a width larger than the width of the inlet 521. For example, the top end 894 of the sealing member 892 may be formed to have a width larger than the width of the inlet 521 to prevent further insertion of the nozzle 890. According to an embodiment, the tapered shape of the sealing member 892 may allow a side surface 892*a* to be in close contact with the inlet 521 and prevent backflow of the filler 899 during injection of the filler 899 from the nozzle 890. For example, the sealing member 892 may seal the inlet 521 by a force pressing vertically on the nozzle 890.

Figure 19:
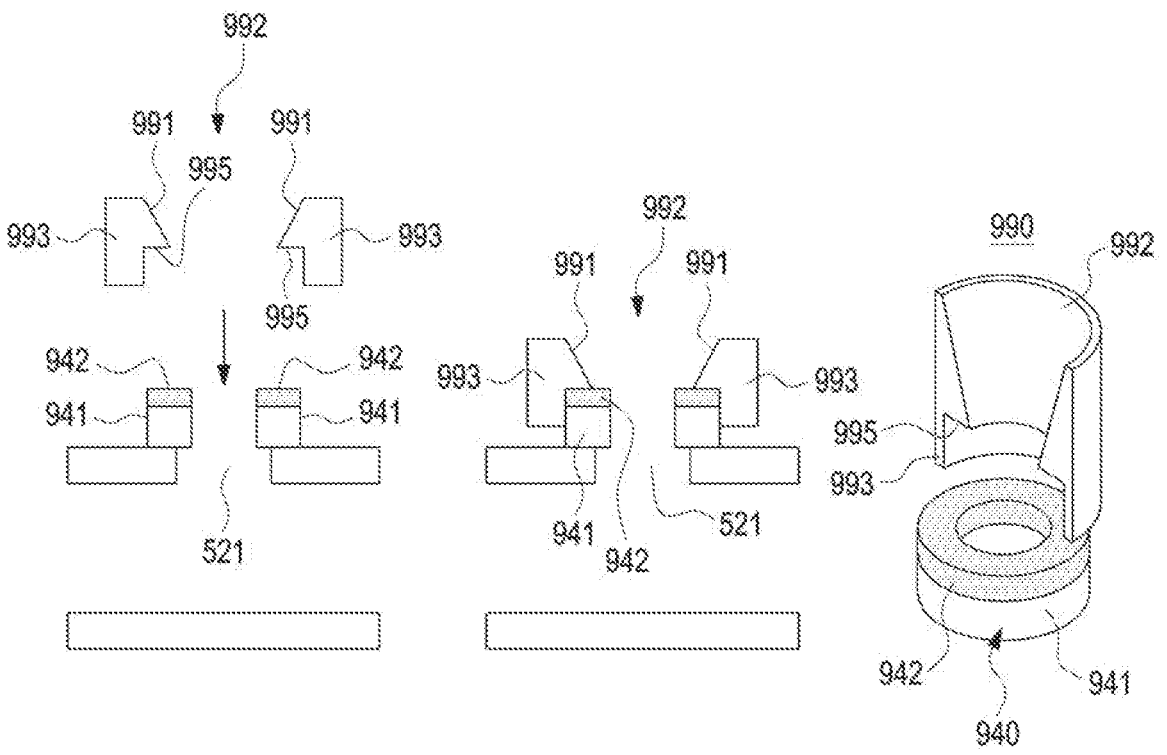
FIG. 19 is a diagram illustrating a backflow prevention structure according to various embodiments of the disclosure.
Figure 20:
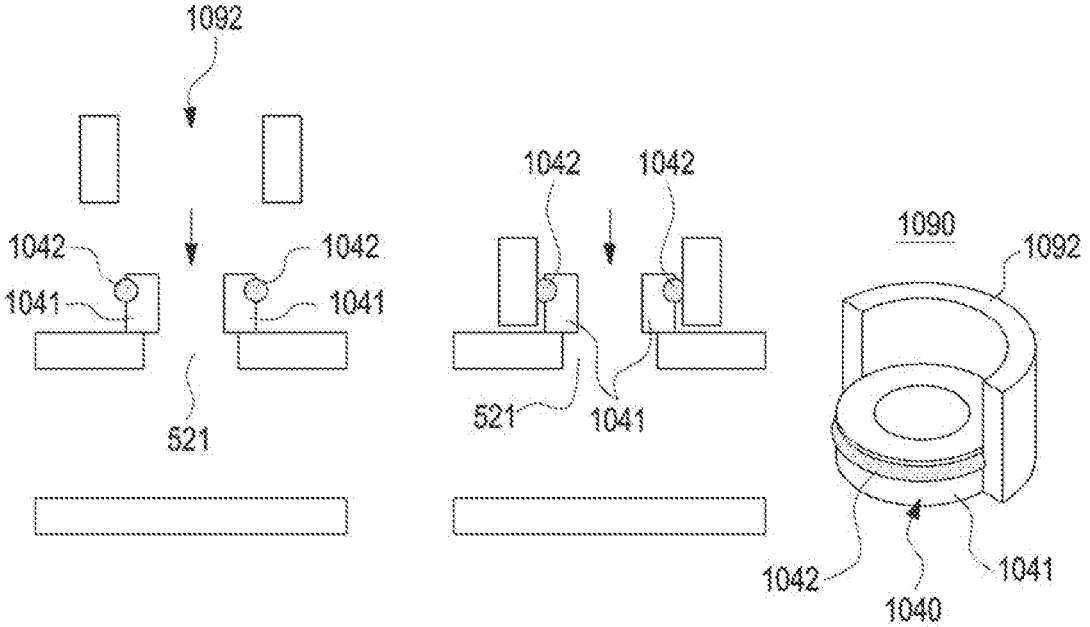
FIG. 20 is a diagram illustrating a backflow prevention structure according to various embodiments of the disclosure.
Figure 21:
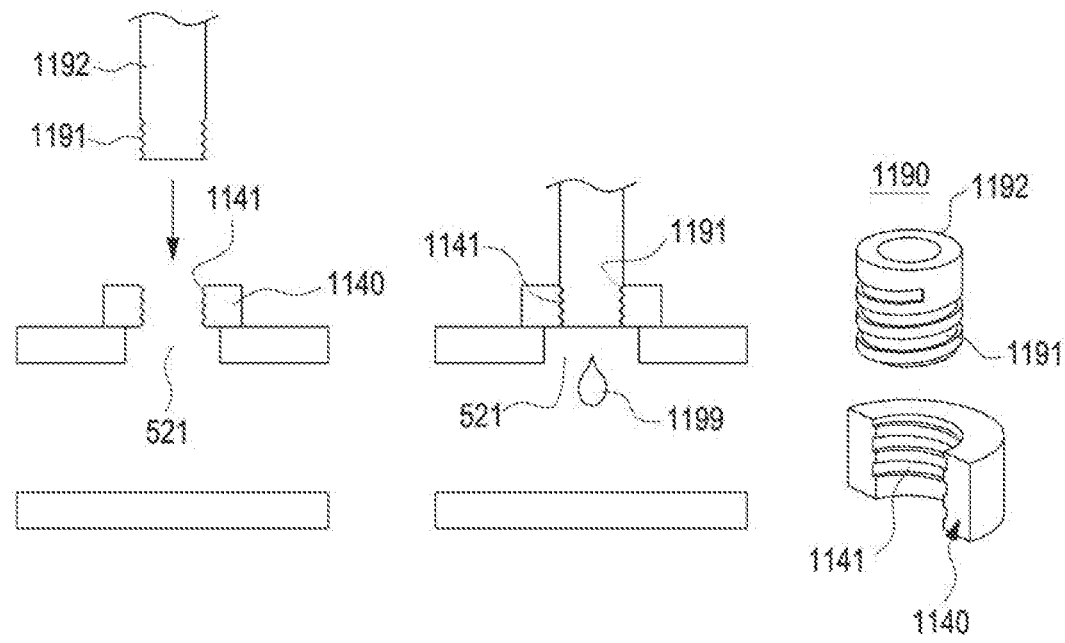
FIG. 21 is a diagram illustrating a backflow prevention structure according to various embodiments of the disclosure.

FIG. 19 is a diagram illustrating a backflow prevention structure according to various embodiments of the disclosure. FIG. 20 is a diagram illustrating a backflow prevention structure according to various embodiments of the disclosure. FIG. 21 is a diagram illustrating a backflow prevention structure according to various embodiments of the disclosure.

Referring to FIGS. 19 to 21, backflow prevention structures may be provided by combining sealing portions 992, 1092, and 1192 included in nozzles 990, 1090, and 1190 with sealing members 940, 1040, and 1140 disposed on the second substrate 520.

According to various embodiments, the sealing portions 992, 1092, and 1192 and the sealing members 940, 1040, and 1140 may be fastened with each other. For example, the sealing portions 992, 1092, and 1192 and the sealing members 940, 1040, and 1140 may contact and be engaged with each other to prevent backflow of fillers 999, 1099, and 1199 injected from the nozzles 990, 1090, and 1190.

According to various embodiments, referring to FIG. 19, the sealing portion 992 may be provided in the form of a nut, and the sealing member 940 may be provided in the form of a bolt. According to an embodiment, the sealing portion 992 may include a tapered injection portion 991, a first contact area 995 located under the injection portion 991 to contact the sealing member 940, and a peripheral area 993 to surround the sealing member 940. According to an embodiment, the sealing member 940 may include a base portion 941 disposed near the inlet 521 and a second contact area 942 disposed on the base portion 941. According to an embodiment, the base portion 941 may be formed of a metal material, and the second contact area 942 may be formed of a rubber material. For example, during injection of the filler, the nozzle 990 may press the sealing member 940 in the vertical direction, and the first contact area 995 may compress the second contact area 942 formed of rubber, thereby sealing the inlet 521. According to an embodiment, the first contact area 995 and the second contact area 942 may have shapes corresponding to each other and be formed to be flat. As the first contact area 995 and the second contact area 942 are formed to be flat, a contact area and sealing efficiency may be increased. According to an embodiment, the second contact area 942 may be formed to have an outer diameter larger than an inner diameter of the peripheral area 993. Therefore, a coupling force between the second contact area 942 and the peripheral area 993 may be increased, and the sealing efficiency may be improved.

According to various embodiments, referring to FIG. 20, the sealing portion 1092 may be provided in the shape of a cylinder, and the sealing member may be provided in the shape of a ring. According to an embodiment, a distal end of the nozzle 1090 may be provided as a cylindrical sealing portion 1092. According to an embodiment, the sealing member 1040 may include a base portion 1041 disposed near the inlet 521 and a sealing area 1042 disposed to surround all or a portion of the base portion 1041. For example, the base portion 1041 may be formed of a metal material, and the sealing area 1042 may be formed of a rubber material. According to an embodiment, the sealing area 1042 may be formed to have an outer diameter larger than an inner diameter of the sealing portion 1092. In addition, the description of the sealing portion 1092 and the sealing member 1040 may be adapted from the description of the sealing portion 992 and the sealing member 940 of FIG. 19.

According to various embodiments, referring to FIG. 21, the sealing portion 1192 may be provided in the form of a male thread, and the sealing member 1140 may be provided in the form of a female thread. According to an embodiment, the sealing portion 1192 may include a first threaded area 1191, and the sealing member 1140 may include a second threaded area 1141. For example, the sealing portion 1192 and the sealing member 1140 may be screwed together such that the filler 1199 may be injected into the internal space of the circuit board module, while the nozzle 1190 and the sealing member 1140 are shielded from each other. However, this is an example, and it will be understood that that the nozzle 1190 may be provided in the form of a female thread, and the sealing member 1140 may be provided in the form of a male thread.

According to various embodiments of the disclosure, the circuit board module may be formed by stacking three or more substrates. In the following description, a backflow prevention structure when three or more substrates are stacked according to various embodiments will be described with reference to the drawings.

Figure 22:
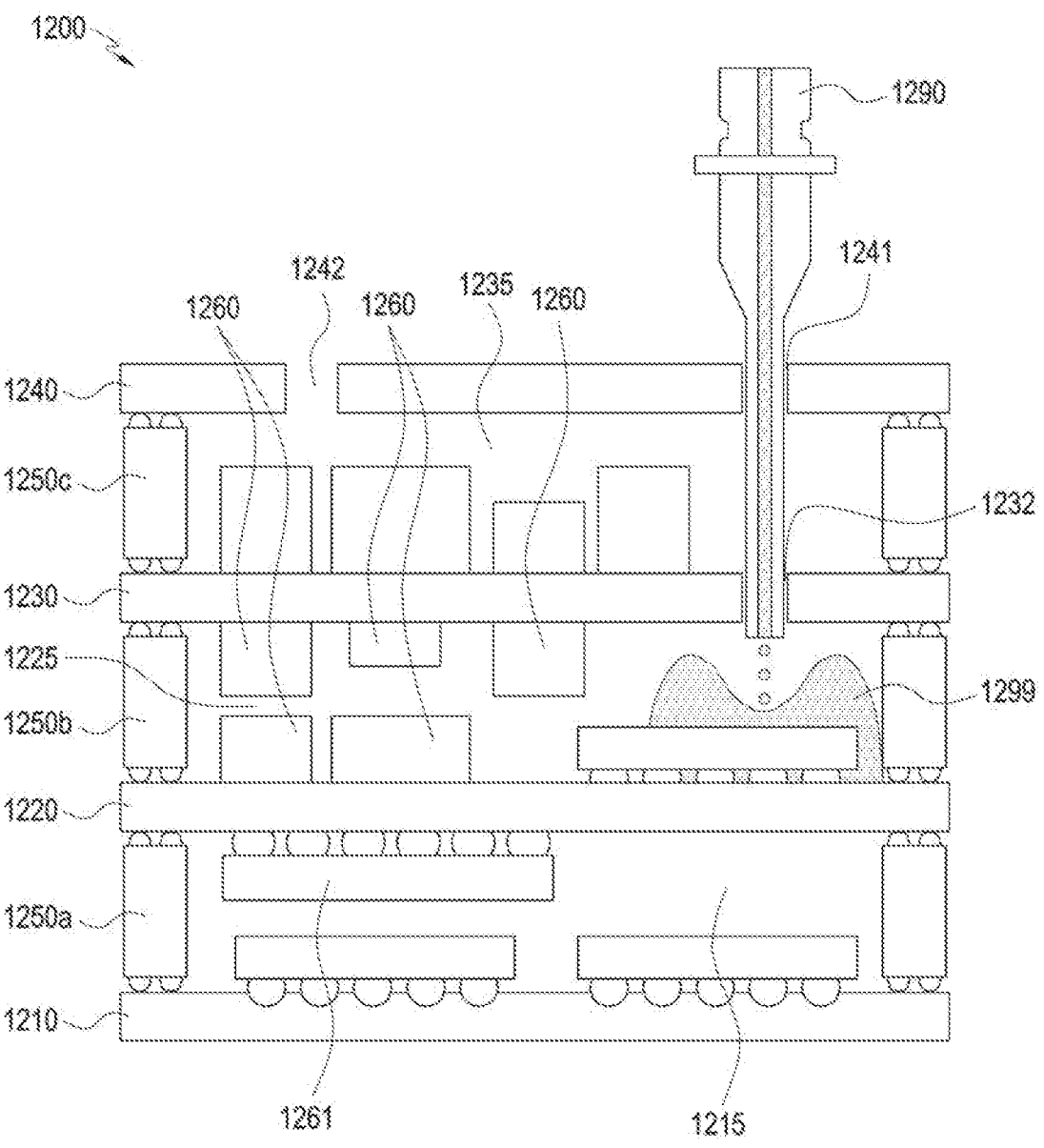
FIG. 22 is a diagram illustrating a multi-layer stacked circuit board module according to various embodiments of the disclosure.
Figure 23:
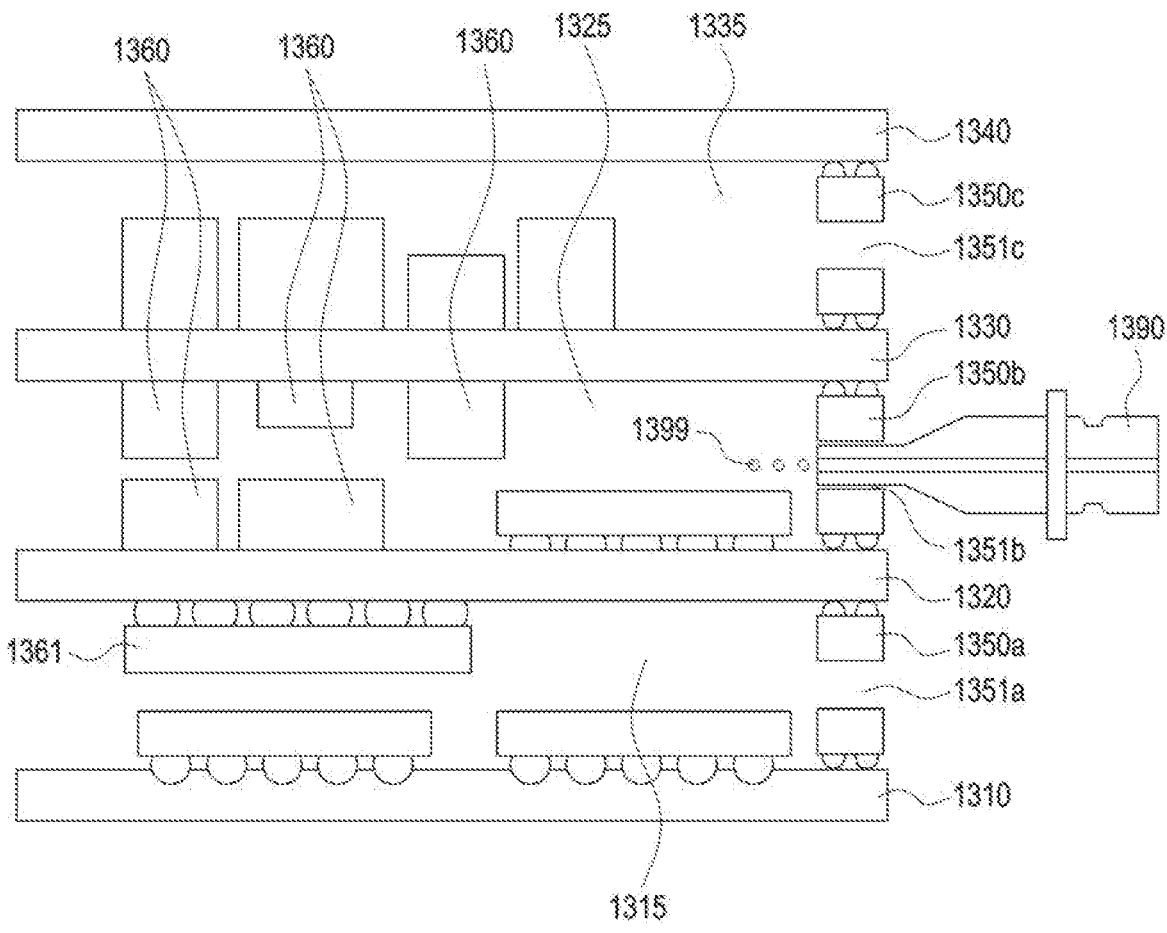
FIG. 23 is a diagram illustrating a multi-layer stacked circuit board module according to various embodiments of the disclosure.

FIG. 22 is a diagram illustrating a multi-layer stacked circuit board module according to various embodiments of the disclosure. FIG. 23 is a diagram illustrating a multi-layer stacked circuit board module according to various embodiments of the disclosure.

Referring to FIG. 22, a circuit board module 1200 may include a first substrate 1210, a second substrate 1220, a third substrate 1230, and a fourth substrate 1240, and may be formed by stacking the substrates 1210-1240 sequentially. In addition, a plurality of interposers 1250*a*, 1250*b*, and 1250*c* may be disposed among the substrates to connect the substrates and provide internal spaces 1215, 1225, and 1235 among the substrates. The circuit board module 1200 may include components 1260 and a heat source 1261. The fourth substrate 1240 may include an inlet 1241 configured to receive a nozzle 1290, and an opening 1242.

According to various embodiments, referring to FIG. 22, inlets 1241 and 1232 may be formed on all or some of the substrates 1210, 1220, 1230, and 1240 forming the circuit board module 1200. For example, the inlets 1241 and 1232 may be formed on both the fourth substrate 1240 and the third substrate 1230, and the positions of the inlets 1241 and 1232 may correspond to each other. According to an embodiment, a nozzle 1290 may penetrate both the first inlet 1241 and the second inlet 1232 and apply a filler 1299 to the internal space 1222 between the second substrate 1220 and the third substrate 1230. According to an embodiment, the fourth substrate 1240 may include a third inlet 1242. The third inlet 1242 may function as an inlet for insertion of the nozzle 1290 and/or an opening for directing an air flow within the circuit board module 1200 (e.g., the first opening 522*a* and the second opening 522*b* of FIG. 5).

According to various embodiments, and referring to FIG. 23, a circuit board module 1300 may include a first substrate 1310, a second substrate 1320, a third substrate 1330, and a fourth substrate 1340, and may be formed by stacking the substrates 1310-1340 sequentially. In addition, a plurality of interposers 1350*a*, 1350*b*, and 1350*c* may be disposed among the substrates to connect the substrates and provide internal spaces 1315, 1325, and 1335 among the substrates. The circuit board module 1300 may include components 1360 and a heat source 1361. All or some of a plurality of interposers 1350*a*, 1350*b*, and 1350*c* may include inlets 1351*a*, 1351*b*, and 1351*c*. The configuration of a circuit board module 1300 according to an embodiment may be wholly or partially identical or similar to the configuration of the circuit board module 1200 described above, and thus a redundant description may be omitted.

According to various embodiments, a nozzle 1390 may be inserted into a first inlet 1351*a*, a second inlet 1351*b*, and/or a third inlet 1351*c* and inject a filler 1399 into an internal space of the circuit board module 1300.

Figure 24:
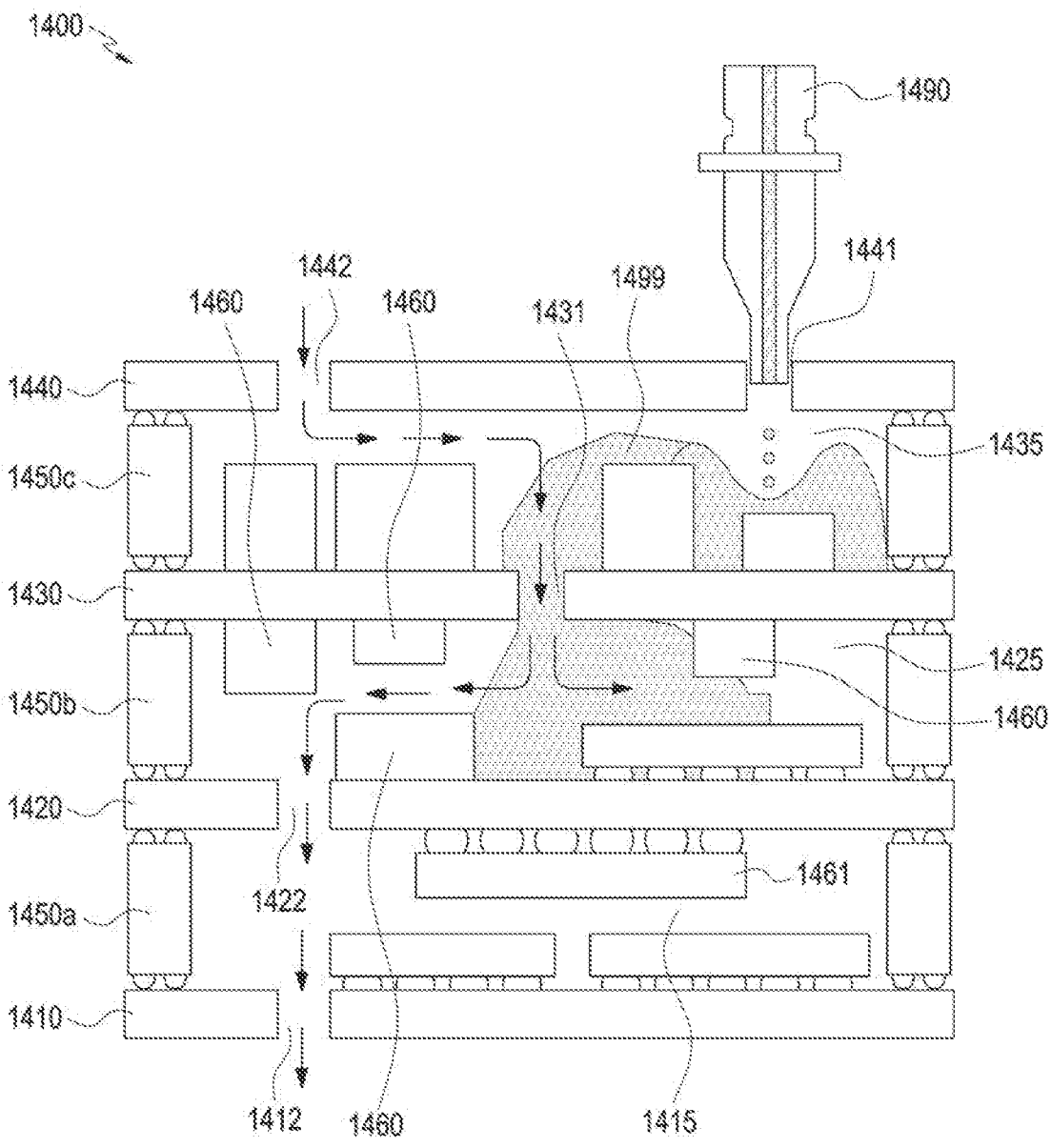
FIG. 24 is a diagram illustrating a multi-layer stacked circuit board module and injection of a filler therein according to various embodiments of the disclosure.
Figure 25:
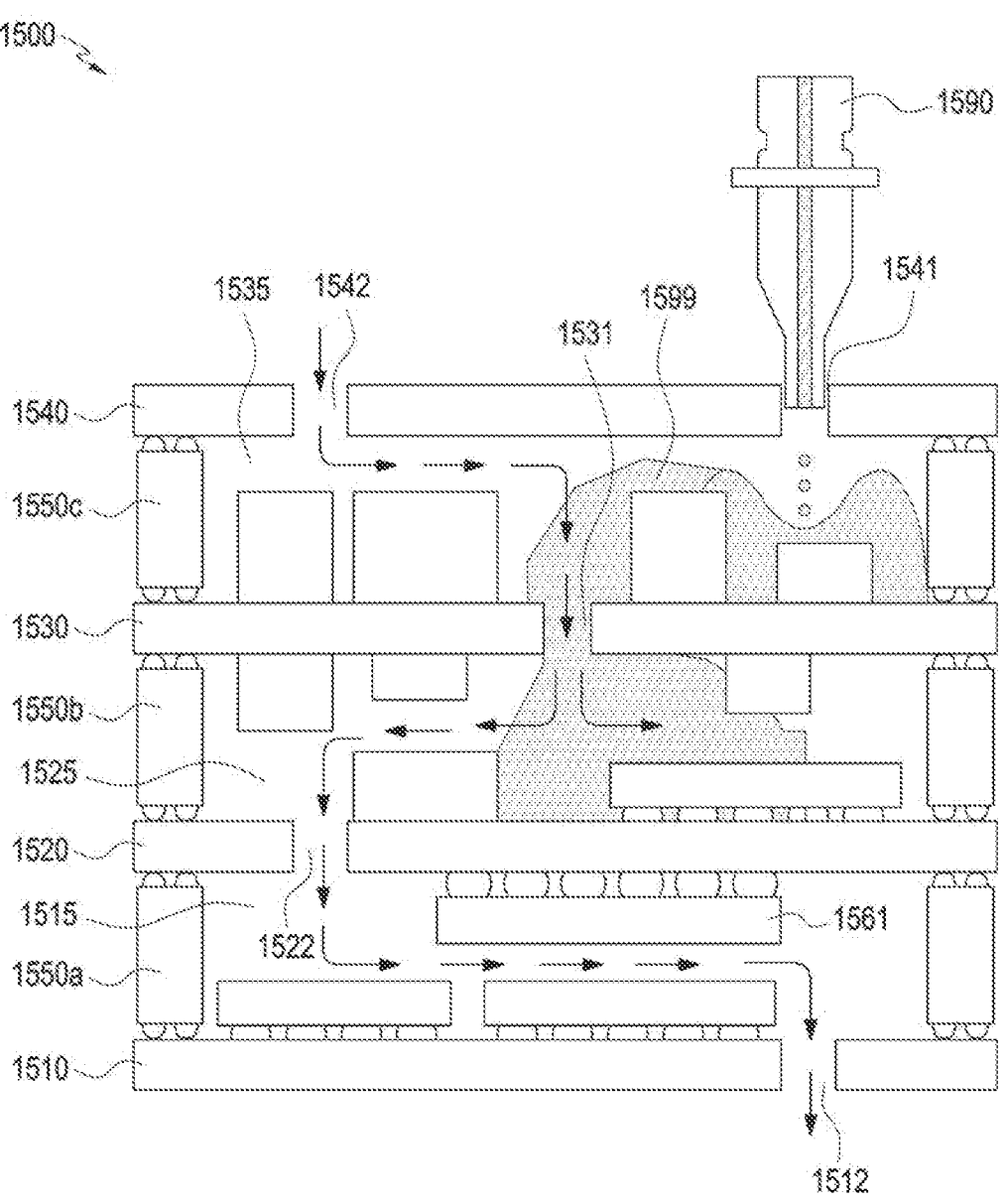
FIG. 25 is a diagram illustrating a multi-layer stacked circuit board module and injection of a filler therein according to various embodiments of the disclosure.

FIG. 24 is a diagram illustrating a multi-layer stacked circuit board module and injection of a filler therein according to various embodiments of the disclosure. FIG. 25 is a diagram illustrating a multi-layer stacked circuit board module and injection of a filler therein according to various embodiments of the disclosure Referring to FIG. 24, a circuit board module 1400 may include a first substrate 1410, a second substrate 1420, a third substrate 1430, and a fourth substrate 1440, and may be formed by stacking the substrates 1410-1440 sequentially. In addition, a plurality of interposers 1450*a*, 1450*b*, and 1450*c* may be disposed among the substrates to connect the substrates and provide internal spaces 1415, 1425, and 1435 among the substrates. The circuit board module 1400 may include components 1460 and a heat source 1461. The fourth substrate 1440 may include an inlet 1441 configured to receive a nozzle 1490, and an opening 1442. The configuration of the circuit board module 1400 of FIG. 24 may be wholly or partially identical or similar to the configuration of the circuit board module 1200 and 1300 of FIGS. 22 and/or 23, and thus a redundant description may be omitted.

According to various embodiments, referring to FIG. 24, an air flow for application of a filler 1499 may be directed within the circuit board module 1400 in which three or more substrates are stacked. For example, with the filler 1499 injected into a first internal space 1435 of the circuit board module 1400, an air flow may be directed within the circuit board module 1400 to apply the filler 1499 to all or some of the first internal space 1435, a second internal space 1425, and/or a third internal space 1415. According to an embodiment, the first opening 1442 formed on a fourth substrate 1440 and the second opening 1412 formed on a first substrate 1410 may direct an air flow in the internal spaces of the circuit board module 1400. For example, with the filler 1499 injected into the third internal space 1435, air may flow into the first opening 1442 and exit from the second opening 1412, and depending on the flow, the filler 1499 may be applied within the internal spaces 1415, 1425, and 1435 in response to the air flow. According to an embodiment, third opening(s) 1422 and 1432 may be formed on the second substrate 1420 and/or the third substrate 1430 to provide an air path and/or a path of the filler 1499 between the first opening 1442 and the second opening 1412.

Referring to FIG. 25, a circuit board module 1500 may include a first substrate 1510, a second substrate 1520, a third substrate 1530, and a fourth substrate 1540, and may be formed by stacking the substrates 1510-1540 sequentially. In addition, a plurality of interposers 1550*a*, 1550*b*, and 1550*c* may be disposed among the substrates to connect the substrates and provide internal spaces 1515, 1525, and 1535 among the substrates. The circuit board module 1500 may include components 1560 and a heat source 1561. The fourth substrate 1540 may include an inlet 1541 configured to receive a nozzle 1590, and an opening 1542. The configuration of the circuit board module 1500 of FIG. 25 may be wholly or partially identical or similar to the configuration of the circuit board module 1200 and 1300 of FIGS. 22 and/or 23, and thus a redundant description may be omitted.

According to an embodiment, referring to FIG. 15, the first opening 1542, the second opening 1512, and/or the third opening 1522 may be disposed at positions for determining the direction of an air flow within the circuit board module 1500. For example, the third opening 1522 may be located opposite to the inlet 1541 with respect to the horizontal direction to further direct a horizontal flow of air in the internal spaces 1515, 1525, and 1535. In another example, the third opening 1422 may be located on the same side as the inlet 1541 with respect the horizontal direction to further direct a vertical flow of air in the internal spaces 1515, 1525, and 1535.

Figure 26:
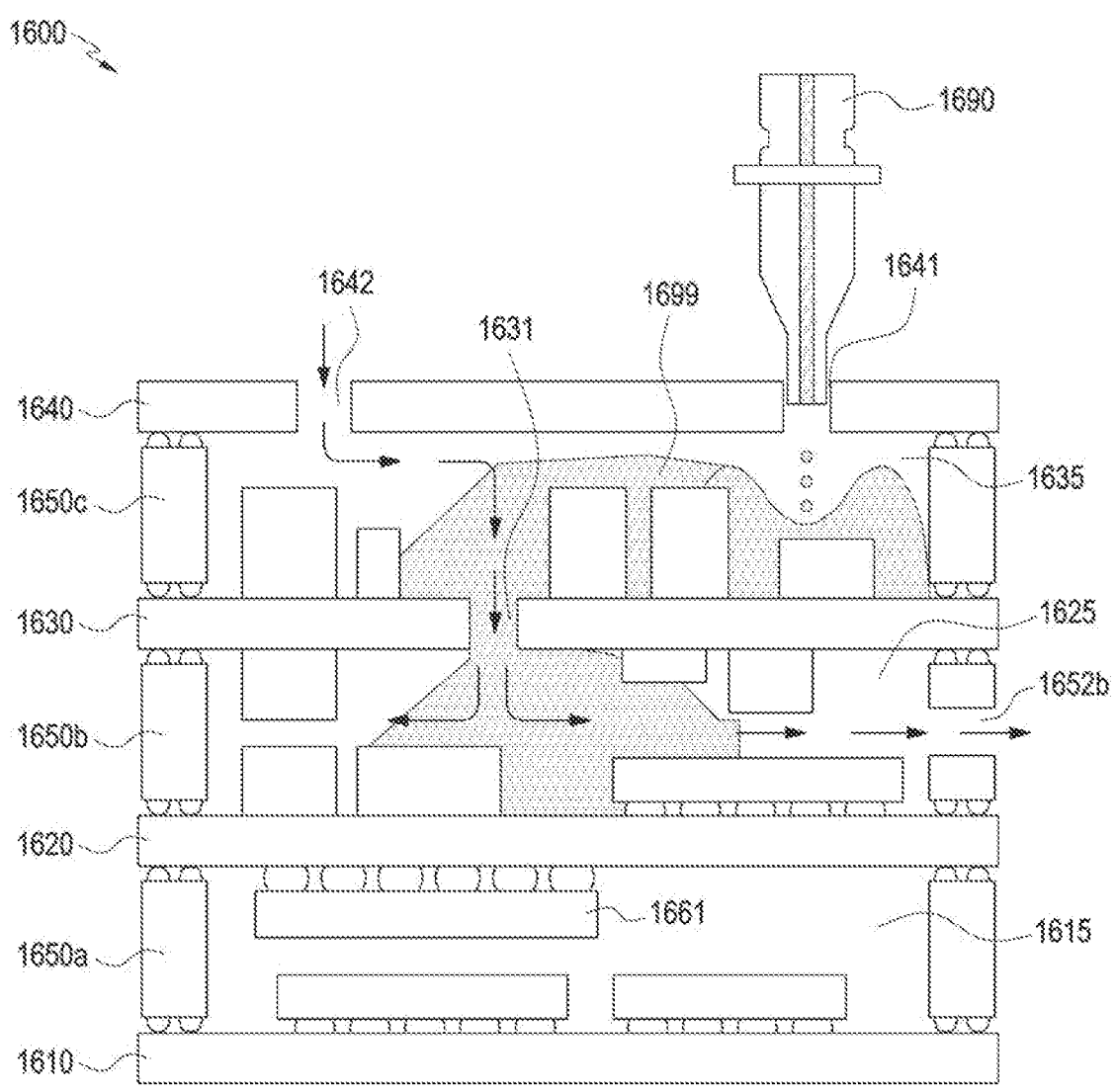
FIG. 26 is a diagram illustrating a multi-layer stacked circuit board module and injection of a filler therein according to various embodiments of the disclosure.
Figure 27:
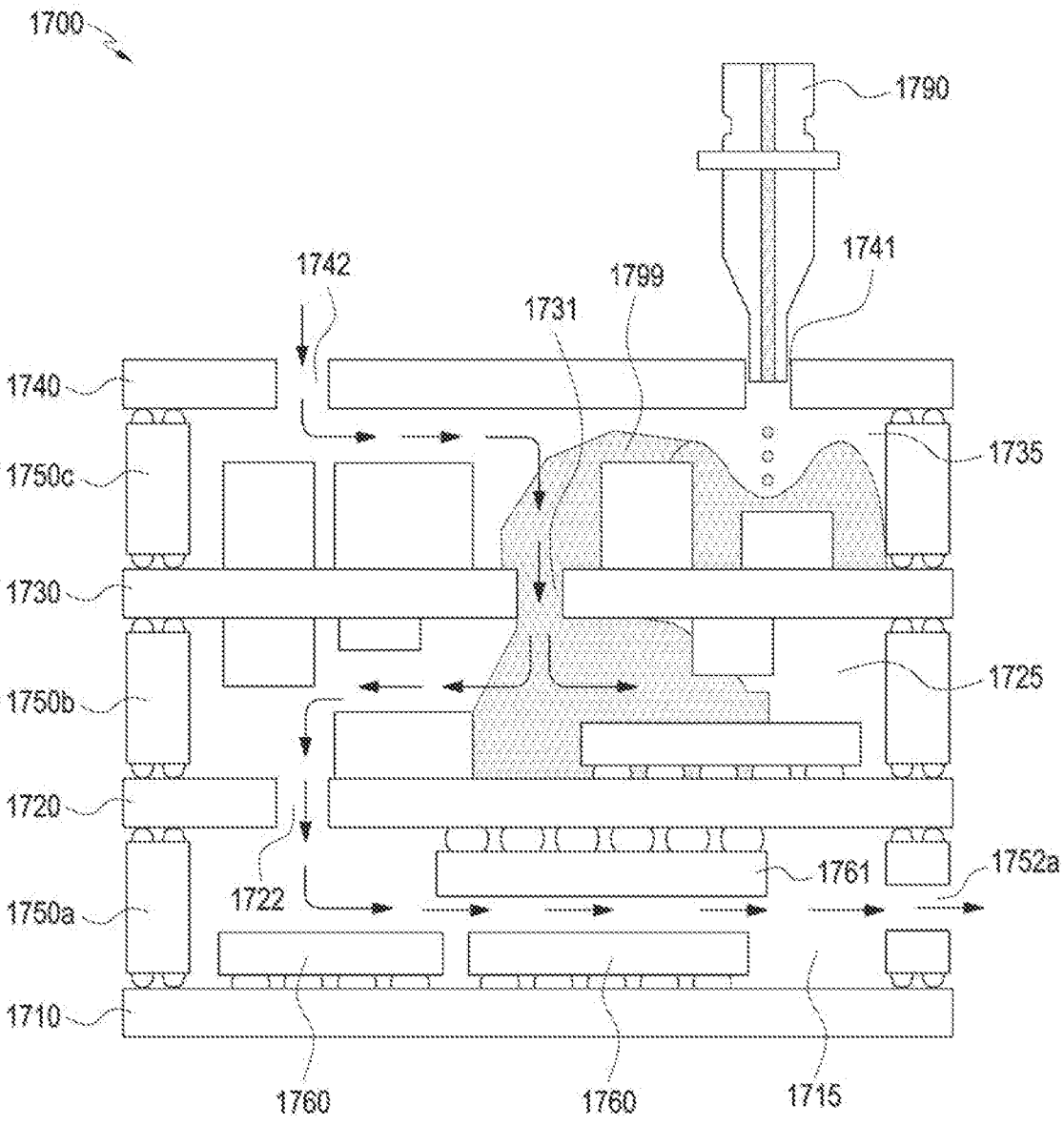
FIG. 27 is a diagram illustrating a multi-layer stacked circuit board module and injection of a filler therein according to various embodiments of the disclosure.

FIG. 26 is a diagram illustrating a multi-layer stacked circuit board module and injection of a filler therein according to various embodiments of the disclosure. FIG. 27 is a diagram illustrating a multi-layer stacked circuit board module and injection of a filler therein according to various embodiments of the disclosure.

Referring to FIG. 26, a circuit board module 1600 may include a first substrate 1610, a second substrate 1620, a third substrate 1630, and a fourth substrate 1640, and may be formed by stacking the substrates 1610-1640 sequentially. In addition, a plurality of interposers 1650*a*, 1650*b*, and 1650*c* may be disposed among the substrates to connect the substrates and provide internal spaces 1615, 1625, and 1635 among the substrates. The circuit board module 1600 may include components 1660 and a heat source 1661. The fourth substrate 1640 may include an inlet 1641 configured to receive a nozzle 1690, and an opening 1642.

The circuit board module 1600 may include a first opening 1642 and a second opening 1652*b* formed to face different directions. The circuit board module 1600 of FIG. 26 may be wholly or partially identical or similar to the circuit board module 1400 of FIG. 22, and thus a redundant description may be omitted.

According to various embodiments, referring to FIG. 26, the first opening 1642 may be formed on a fourth substrate 1640 and the second opening 1652*b* may be formed on interposer 1650*b*. According to an embodiment, air introduced from the first opening 1642 formed on the fourth substrate 1640 may exit through the second opening 1652*b*, thereby directing an air flow within the circuit board module 1600. As described above, a third opening 1631 may be formed on the third substrate 1630. Likewise, as an air flow is directed within the circuit board module 1600, the direction of application of a filler 1699 may change as described above, and thus a redundant description may be omitted. The side opening 1652a may be formed on any one of or all of the interposers 1650a-1650c

Referring to FIG. 27, a circuit board module 1700 may include a first substrate 1710, a second substrate 1720, a third substrate 1730, and a fourth substrate 1740, and may be formed by stacking the substrates 1710-1740 sequentially. In addition, a plurality of interposers 1750a, 1750b, and 1750c may be disposed among the substrates to connect the substrates and provide internal spaces 1715, 1725, and 1735 among the substrates. The circuit board module 1700 may include components 1760 and a heat source 1761. The fourth substrate 1740 may include an inlet 1741 configured to receive a nozzle 1790, and an opening 1742. According to various embodiments, referring to FIG. 27, the second opening 1752a may be formed in some or all of a first interposer 1750a. Positions at which the second opening 1750a is formed may be determined according to an area to which the filler 1799 is to be applied or the positions of components 1760 disposed on the circuit board module 1700. For example, the second opening 1752a may be disposed to provide an air flow path for application of filler 1799 to an area corresponding to a heat source 1761. An opening 1731 may be provided on the third substrate 1730, and an opening 1722 may be provided in the second substrate 1720. The side opening 1752a may be formed on any one of or all of the interposers 1750a-1750c.

Figure 28:
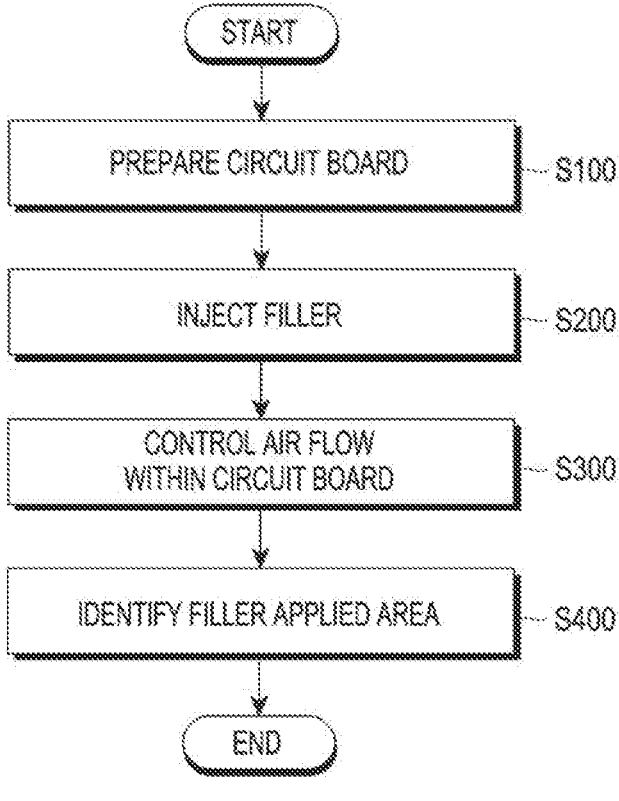
FIG. 28 is a flowchart illustrating a method of injecting a filler into a circuit board module to fabricate a circuit board module to which a filler is applied according to various embodiments of the disclosure.

FIG. 28 is a flowchart illustrating a method of injecting a filler into a circuit board module to fabricate a circuit board module to which a filler is applied according to various embodiments of the disclosure.

Referring to FIG. 25, the method of injecting a filler into a circuit board module may include preparing a circuit board module provided with a backflow prevention structure in operation S100, injecting a filler through an inlet in operation S200, and controlling an air flow within the circuit board module through a first opening and a second opening in operation S300.

The method of manufacturing a circuit board module according to various embodiments may be implemented by an automated circuit board module manufacturing system. Further, the circuit board module manufacturing system may include the nozzles described above according to the various embodiments described above.

In operation S100 of preparing a circuit board module, the circuit board module may include the circuit board modules described above according to various embodiments described above, which may include the sealing members described above according to various embodiments described above.

In operation S200 of injecting a filler, the manufacturing system may inject the filler into the circuit board through the inlet 521 of the circuit board module. According to an embodiment, the circuit board module may include a sealing member according to various embodiments described above, and the nozzle may penetrate the sealing member to inject the filler into the circuit board module. According to an embodiment, the manufacturing system may inject the filler for a predetermined time. Alternatively, the manufacturing system according to an embodiment may determine a filler injection time based on a result of identifying a filler applied area in operation S400. For example, the manufacturing system may determine a filler injection end time based on the result of identifying the filler applied area in operation S400 (e.g., the filler 599 is applied to the area corresponding to the inspection hole 529, see FIGS. 9 to 12).

In operation S300 of controlling an air flow within the circuit board module, the manufacturing system may introduce or exhaust air through first and second openings included in the circuit board module according to various embodiments described above. For example, the manufacturing system may introduce air through the first opening and exhaust air through the second opening to direct the air flow within the circuit board module. According to an embodiment, the manufacturing system may introduce and/or exhaust air for a predetermined time. In an example, the duration of a time period during which air is introduced and/or sucked in may be set to be longer than the duration of a time period during which the filler is injected. In addition, according to an embodiment, the manufacturing system may determine a time period during which air is introduced based on the result of identifying the filler applied area in operation S400. For example, the manufacturing system may determine an end time of air introduction based on the result of identifying the filler applied area in operation S400 (e.g., the filler 599 is applied to the area corresponding to the inspection hole 529, see FIGS. 9 to 12).

According to an embodiment, the manufacturing system may perform operation S200 of injecting the filler and operation S300 of controlling an air flow simultaneously or sequentially.

According to an embodiment, the manufacturing system may control the air flow within the circuit board module such that operation S200 of injecting the filler is performed longer than operation S300 of controlling the air flow. According to various embodiments, it may take a specific time to cure the filler after the injection of the filler from the nozzle, and the manufacturing system may control the air flow within the circuit board module until the injected filler is cured, thereby controlling the application area of the filler.

According to an embodiment, the manufacturing system may determine, through the inspection hole 529 (see FIGS. 7 to 10), whether the filler has been applied over a required area, as described above. Further, the manufacturing system may be configured to repeat or end operation S200 of injecting the filler and/or operation S300 of introducing air. According to an embodiment, in the case where the filler injection operation S200 and/or the air introduction operation S300 are performed for a predetermined time, when determining that the filler has not reached the area corresponding to the inspection hole 529, the manufacturing system may repeat the filler injection operation S200 and/or the air introduction operation S300. According to an embodiment, the manufacturing system may terminate the filler injection operation S200 and/or the air introduction operation S300, when determining that the filler has been applied to the area corresponding to the inspection hole 529.

According to various embodiments, a circuit board module may be provided, including a first substrate, a second substrate including a first opening and disposed above the first substrate, a first interposer disposed between the first substrate and the second substrate to electrically connect the first substrate and the second substrate, and providing a first space between the first substrate and the second substrate, a sealing member attached to cover the first opening, and a filler disposed between the first substrate and the second substrate. The sealing member may include an insertion area allowing a nozzle for injecting the filler to be inserted into the first opening, and a second opening allowing air to be introduced into the first space therethrough and a third opening allowing air to be exhausted from the first space therethrough may be formed on at least one of the first substrate, the second substrate, or the first interposer.

According to various embodiments, the second opening and the third opening may be formed on the second substrate.

According to various embodiments, the second opening may be formed on the second substrate, and the third opening may be formed on the first interposer.

According to various embodiments, the filler may be disposed under the first opening.

According to various embodiments, the second opening may be formed on a first side of the second substrate, and the third opening may be formed on a second side opposite to the first side.

According to various embodiments, a distance between the first opening and the second opening or a distance between the first opening and the third opening may be larger than a distance between the second opening and the third opening.

According to various embodiments, a distance between the first opening and the second opening or a distance between the first opening and the third opening may be set to be equal to or larger than a threshold distance, and the threshold distance may be determined in consideration of at least one of an injection rate or an injection time of the filler.

According to various embodiments, the insertion area may be expanded when pressure is applied, and may be restored and substantially seal the first opening when the pressure is removed.

According to various embodiments, the insertion area may be cross-shaped.

According to various embodiments, the sealing member may include a deformation-resistant area on a top surface thereof to prevent deformation of the sealing area, and the deformation-resistant area may overlap the insertion area or be disposed adjacent to the insertion area.

According to various embodiments, the sealing member may be combined with the nozzle and prevent backflow of the filler.

According to various embodiments, the circuit board module may further include a third substrate disposed above the second substrate, and a second interposer connecting the second substrate and the third substrate and providing a second space between the second substrate and the third substrate. The first opening may be formed on the third substrate, and the second opening and the third opening may be formed on at least one of the third substrate, the first substrate, the first interposer, or the second interposer.

According to various embodiments, the second substrate may include a fourth opening allowing the filler to be introduced from the second space into the first space or allowing air to be introduced from the second opening into the first space.

According to various embodiments, the circuit board module may include a heat source disposed on the first substrate or the second substrate, and the filler may be applied to an area corresponding to a position where the heating source is disposed.

According to various embodiments, the sealing member may be formed of a rubber material, and the rubber material may include conductivity or non-conductivity.

According to various embodiments, the filler may be formed in a liquid or semi-solid state.

According to various embodiments, a method of injecting a filler may include preparing a circuit board module, wherein the circuit board module includes a first substrate, a second substrate including a first opening and disposed above the first substrate, an interposer disposed between the first substrate and the second substrate to connect the first substrate and the second substrate and providing a first space between the first substrate and the second substrate, and a sealing member attached to cover the first opening, and where a second opening allowing air to be introduced into the first space therethrough and a third opening allowing air to be exhausted from the first space therethrough are formed on at least one of the first substrate, the second substrate, or the first interposer, injecting the filler through the first opening, and injecting air through the second opening.

According to various embodiments, the injection of air through the second opening may end after the injection of the filler.

According to various embodiments, the circuit board module may further include a sealing member including a nozzle insertion area and disposed on the first opening, and the method may further include inserting the nozzle into the nozzle insertion area by pressing the nozzle.

According to various embodiments, the second opening and the third opening may be formed on the second substrate.

According to various embodiments of the disclosure, a sealing member includes an insertion area into which a nozzle is inserted, which may allow injection of a filler when the nozzle is inserted, and substantially seal an inlet and thus prevent backflow of the filler when the nozzle is removed.

According to various embodiments of the disclosure, an application area for the filler may be set and backflow of the filler through the inlet or another opening may be prevented by controlling an air flow inside the printed circuit board.

The effects to be obtained from the disclosure are not limited to those mentioned above, and other effects not mentioned will be apparent to those skilled in the art from the following description.

The embodiments of the disclosure disclosed in the specification and the drawings provide merely specific examples to easily describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. An electronic device comprising:
a housing comprising a front side and a rear side; and
a circuit board module, provided in the housing between the front side and the rear side, the circuit board module comprising:
a first printed circuit board (PCB);
a second PCB comprising an inlet;
an interposer configured to electrically connect the first PCB and the second PCB, and providing a space between the first PCB and the second PCB; and
a filler provided in the space and configured to dissipate heat,
wherein the inlet is configured such that the filler is injectable through the inlet,
wherein the electronic device further comprises a second opening on at least one of the first PCB, the second PCB, or the interposer, the second opening being configured to allow air to be exhausted from the space while the filler is being injected into the space, and
wherein the second opening is at a position at which no filler is provided.

2. The electronic device of claim 1, wherein the first PCB comprises a first side and a second side opposite the first side, wherein the second side of the first PCB faces the second PCB, wherein the filler is provided on at least a portion of the second side of the first PCB, wherein the electronic device further comprises a heat source provided on a portion of the first side of the first PCB, and wherein the portion of the first side of the first PCB where the heat source is provided is opposite to the at least the portion of the second side of the first PCB wherein the filler is provided.

3. The electronic device of claim 2, further comprising:

a support member provided between the front side and the rear side; and a display provided between the front side and the support member, wherein the circuit board module is provided between the support member and the rear side, and wherein the first side of the first PCB faces the support member.

4. The electronic device of claim 2, wherein the filler comprises a thermal interface material (TIM) configured to dissipate heat generated by the heat source.

5. The electronic device of claim 2, wherein the heat source comprises at least one of a power management integrated circuit, a power amplifier, an application processor, a communication processor, a charger integrated circuit, a display driver integrated circuit, or a communication circuit.

6. The electronic device of claim 1, further comprising:

at least one component provided on the second side of the first PCB and that generates heat.

7. The electronic device of claim 1, further comprising:

a sealing member at least partially covering the inlet.

8. The electronic device of claim 7, wherein the sealing member comprises an insertion area configured to allow a nozzle for injecting the filler to be inserted into the inlet.

9. The electronic device of claim 8, wherein the insertion area is configured to be expanded when pressure is applied, and configured to be restored and substantially seal the inlet when the pressure is removed.

10. The electronic device of claim 8, wherein the insertion area is slit-shaped.

11. The electronic device of claim 8, wherein the sealing member comprises a deformation-resistant area on a top surface thereof configured to prevent deformation of the sealing member, and wherein the deformation-resistant area overlaps the insertion area or is provided adjacent to the insertion area.

12. The electronic device of claim 1, further comprising a first opening configured to allow air to be introduced into the space therethrough.

13. The electronic device of claim 12, wherein the first opening and the second opening are provided on the second PCB.

* * * * *